United States Patent
Maturana et al.

(10) Patent No.: US 10,037,443 B2
(45) Date of Patent: Jul. 31, 2018

(54) INDUSTRIAL SIMULATION USING REDIRECTED I/O MODULE CONFIGURATIONS

(71) Applicant: Rockwell Automation Technologies, Inc., Mayfield Heights, OH (US)

(72) Inventors: Francisco P. Maturana, Lyndhurst, OH (US); Raymond J. Staron, Chagrin Falls, OH (US); Danny L. Carnahan, Hudson, OH (US); Kenwood H. Hall, Hudson, OH (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 681 days.

(21) Appl. No.: 14/504,118

(22) Filed: Oct. 1, 2014

(65) Prior Publication Data

US 2015/0019191 A1    Jan. 15, 2015

Related U.S. Application Data

(63) Continuation-in-part of application No. 14/303,251, filed on Jun. 12, 2014, which is a continuation of
(Continued)

(51) Int. Cl.
*G06G 7/48*      (2006.01)
*G06G 7/66*      (2006.01)
(Continued)

(52) U.S. Cl.
CPC ............... *G06G 7/66* (2013.01); *G05B 17/02* (2013.01); *G05B 19/0423* (2013.01); *G06F 17/5009* (2013.01); *G05B 2219/13174* (2013.01)

(58) Field of Classification Search
CPC ........ G06G 7/66; G05B 17/02; G06F 17/5009
(Continued)

(56) References Cited

U.S. PATENT DOCUMENTS 5,099,449 A * 3/1992 Dombrosky ......... G05B 19/054
                                                710/58
6,088,624 A * 7/2000 Khan ................. G05B 19/0423
                                                700/19
(Continued)

FOREIGN PATENT DOCUMENTS

EP      1686442       8/2006
EP      1942386 A1    7/2008
(Continued)

OTHER PUBLICATIONS

Dennis Brandl ("Advanced process control in the cloud", Control Engineering Publication 2013).*
(Continued)

*Primary Examiner* — Omar Fernandez Rivas
*Assistant Examiner* — Iftekhar Khan
(74) *Attorney, Agent, or Firm* — Amin, Turocy & Watson, LLP

(57) ABSTRACT

A simulation environment is provided for running a process simulation used to validate an industrial control program. The simulation environment exposes the I/O module configurations defined in the control program and retrieves module configuration information therefrom. This I/O module configuration information is combined with generic, module-specific I/O module profiles to create a pool of available controller I/O points, which can be selectively associated with I/O points in the simulation to create an I/O point mapping. During control program validation, simulated I/O data is exchanged between the process simulation and the I/O module instances in the controller in accordance
(Continued)

with the I/O point mapping. A variation of these techniques for use with cloud-based emulations is also described.

20 Claims, 17 Drawing Sheets

Related U.S. Application Data application No. 13/269,191, filed on Oct. 7, 2011, now Pat. No. 8,756,041.

(60) Provisional application No. 61/450,058, filed on Mar. 7, 2011.

(51) Int. Cl.
*G06F 17/50* (2006.01)
*G05B 17/02* (2006.01)
*G05B 19/042* (2006.01)

(58) Field of Classification Search
USPC .............................................................. 703/7
See application file for complete search history.

(56) References Cited

U.S. PATENT DOCUMENTS

| | | | | |
|---|---|---|---|---|
| 6,236,334 B1* | 5/2001 | Tapperson | ......... | G05B 19/4185 340/3.1 |
| 6,865,509 B1* | 3/2005 | Hsiung | ................ | G05B 15/02 702/182 |
| 7,151,966 B1* | 12/2006 | Baier | ................ | G05B 19/056 700/19 |
| 7,512,906 B1* | 3/2009 | Baier | ................ | G06F 9/4443 700/83 |
| 7,643,891 B2* | 1/2010 | Rule | ................ | G05B 19/042 700/19 |
| 7,721,019 B2* | 5/2010 | Pierce | ................ | G05B 19/054 710/30 |
| 8,196,075 B1* | 6/2012 | Garrault | ............ | G06F 17/5036 716/104 |
| 2004/0078182 A1* | 4/2004 | Nixon | ................ | G05B 17/02 703/22 |
| 2006/0200256 A1* | 9/2006 | Mason | ................ | G05B 19/054 700/65 |
| 2006/0294047 A1* | 12/2006 | Johnston | ............ | G05B 19/0426 |
| 2007/0076264 A1* | 4/2007 | Pierce | ................ | G05B 19/054 358/474 |
| 2007/0142926 A1* | 6/2007 | Hopsecger | ............ | G05B 19/05 700/10 |
| 2007/0173079 A1* | 7/2007 | Kumar | ................ | G05B 19/054 439/50 |
| 2008/0082185 A1* | 4/2008 | Hood | ................ | G05B 19/0426 700/83 |
| 2008/0162104 A1* | 7/2008 | Onishi | ................ | G05B 19/056 703/13 |
| 2008/0307125 A1* | 12/2008 | Hildebran | .......... | G05B 19/0423 710/52 |
| 2009/0043408 A1* | 2/2009 | Keller | ................ | G05B 19/056 700/87 |
| 2009/0085934 A1 | 4/2009 | Baier et al. | | |
| 2009/0089031 A1* | 4/2009 | Sturrock | ................ | G05B 17/02 703/7 |
| 2009/0089701 A1* | 4/2009 | Baier | ................ | G05B 19/0426 715/772 |
| 2009/0089709 A1* | 4/2009 | Baier | ................ | G05B 19/409 715/817 |
| 2010/0256794 A1* | 10/2010 | McLaughlin | ...... | G05B 19/4183 700/110 |
| 2010/0256795 A1* | 10/2010 | McLaughlin | ...... | G05B 19/4183 700/110 |
| 2012/0110216 A1* | 5/2012 | Zhang | ................ | G05B 19/0423 710/14 |
| 2012/0331104 A1* | 12/2012 | Akiyama | ............ | H04L 63/1408 709/217 |
| 2014/0380177 A1* | 12/2014 | Gutermuth | ......... | G05B 19/0423 715/736 |
| 2015/0012118 A1* | 1/2015 | G | ........................ | G05B 19/0426 700/17 |

FOREIGN PATENT DOCUMENTS

| | | | | |
|---|---|---|---|---|
| EP | 2293164 A1 * | 3/2011 | ......... | G05B 19/0428 |
| EP | 2498156 | 9/2012 | | |
| EP | 2778816 | 9/2014 | | |
| EP | 2778816 A1 * | 9/2014 | ....... | G05B 19/41885 |
| WO | WO 2014001037 A2 * | 1/2014 | ............. | H04L 9/008 |

OTHER PUBLICATIONS

Sierra Wireless("M2M cloud platform now connects industrial control systems", Control Engineering Publication 2011).*
European Office Action dated May 12, 2015 for European Patent Application No. 12158430.4, 5 pages.
Extended European Search Report for EP Application Serial No. 15187850.1, dated Jun. 7, 2016, 7 pages.
European Office Action for EP Application Serial No. 15187850.1, dated Jul. 11, 2016, 2 pages.
European Search Report for European Patent Application No. EP12158430 dated Mar. 28, 2013, 8 pages.
Office Action dated Aug. 30, 2013 for U.S. Appl. No. 13/269,191, 25 pages.
Notice of Allowance dated Feb. 7, 2014 for U.S. Appl. No. 13/269,191, 21 pages.
Office Action for European Patent Application No. 12158430.4 dated Feb. 13, 2017, 5 pages.
Non-Final Office Action for U.S. Appl. No. 14/303,251 dated Jun. 2, 2017, 48 Pages.
Final Office Action for U.S. Appl. No. 14/303,251 dated Nov. 13, 2017, 30 pages.
Notice of Allowance for U.S. Appl. No. 14/303,251 dated Feb. 15, 2018, 35 pages.

* cited by examiner

INDUSTRIAL SIMULATION USING REDIRECTED I/O MODULE CONFIGURATIONS

CROSS-REFERENCE TO RELATED APPLICATIONS

This application is a continuation-in-part of, and claims priority to, U.S. patent application Ser. No. 14/303,251, filed on Jun. 12, 2014, and entitled "INDUSTRIAL SIMULATION USING REDIRECTED I/O MODULE CONFIGURATIONS," which is a continuation of U.S. patent application Ser. No. 13/269,191, filed on Oct. 7, 2011, which claims priority to U.S. Provisional Application Ser. No. 61/450,058, filed on Mar. 7, 2011, entitled "INDUSTRIAL SIMULATION USING REDIRECTED I/O MODULE CONFIGURATIONS." The entireties of these related applications are incorporated herein by reference.

TECHNICAL FIELD

The subject application relates generally to industrial control and simulation, and, more particularly, to an industrial simulation environment that leverages I/O module configurations to exchange I/O data with a controller during validation.

BACKGROUND

Industrial controllers and their associated control programming are central to the operation of modern industrial automation systems. These controllers interact with field devices on the plant floor to carry out controlled processes relating to such objectives as manufacture of a product, material handling, batch processing, waste water treatment, and other such processes. The controllers typically exchange data with the field devices using native hardwired I/O or via a plant network such as Ethernet/IP, Data Highway Plus, ControlNet, Devicenet, or the like. The controller receives any combination of digital or analog signals from the field devices indicating a current state of the devices and their associated processes (e.g., temperature, position, part presence or absence, fluid level, etc.), and executes a control program that performs automated decision-making for the controlled processes based on the received signals. The controller then outputs appropriate digital and/or analog control signaling to the field devices in accordance with the decisions made by the control program. These outputs can include device actuation signals, temperature or position control signals, operational commands to a machining or material handling robot, and the like. The control program can comprise any conceivable type of code used to process input signals read into the controller and to control output signals generated by the controller, including but not limited to ladder logic, sequential function charts, function block diagrams, structured text, or other such platforms.

During development of a given control program, a plant simulation is often used to validate the program prior to deployment. This simulation emulates various aspects of the physical system to be regulated by the control program (e.g., actuators, sensors, etc.) and interfaces with the control program under test to exchange I/O data in order to simulate real-time control. The plant simulation generates digital and analog values representing sensor or telemetry data, which are provided to the control program as simulated physical inputs. The control program processes these simulated inputs and generates digital and/or analog output data in accordance with the program algorithms, and provides this output data to the plant simulation. The plant simulation then updates the simulated control input values based on the control outputs provided by the control program in a manner that simulates operation of the real-world system. In this way, the control program can be tested and debugged without putting field equipment and machinery at risk.

There are a number of inefficiencies inherent to conventional industrial simulation techniques that are detrimental to data fidelity, update rates, and simulation accuracy. For example, since there are no physical field devices wired to the controller's I/O modules during simulation, simulated I/O data must be exchanged via a direct connection to the controller's I/O data table. That is, output data generated by the control program is read directly from the controller's data table by the simulation rather than being converted to an electrical signal and transmitted by the controller's physical output points. Likewise, simulated I/O data generated by the simulation must be written directly to the controller's data table rather than being received as an electrical signal at one of the controller's physical inputs. To achieve this linkage between the controller's data table and the simulation, a middleware layer (e.g., an OPC server), is conventionally used to link the simulation's I/O points to the appropriate data table addresses within the controller. I/O data is then exchanged via the middleware layer, placing a non-deterministic layer between the simulation and the controller that can negatively impact transmission latency and data fidelity. This issue is often compounded by the fact that the plant simulation typically executes on a general-purpose computer or workstation, where the computer's operating system functions can interrupt simulation execution during validation.

Moreover, because the simulated I/O data is read from and written to the I/O data table directly by the middleware layer, the I/O modules and their associated module configurations are effectively bypassed during simulation. Consequently, simulated I/O data must be exchanged between the controller and the simulation as engineering units suitable for processing by the control program, rather than as raw values that would normally be received at the controller's I/O and scaled in accordance with the I/O module's user-defined scale factors. Since the I/O module configurations are not taken into consideration during validation, the simulation is rendered less representative of the real-world system. This also leaves the I/O module configurations themselves as well as the control program's behavior given those module configurations untested prior to deployment.

In a related problem, since the I/O module configurations cannot be used during execution of the simulation, it is necessary in some cases to disable or remove the I/O module configurations during simulation to allow the simulated I/O values to be written to the I/O data table registers. Another method for bypassing the I/O module configurations during simulation is to employ temporary controller addresses in the control program in lieu of the actual I/O addresses that will be used to send and receive I/O data when the system is deployed. Both of these techniques necessitate excessive configuration work, both to bypass the I/O module configurations prior to simulation, and to reinstate the module configurations when the system is deployed.

Also, middleware-based simulations, such as those using OPC server as described above, lack the ability to synchronize the respective clocks of the controller and the simulation. This lack of synchronization capability can adversely impact the fidelity of the simulation, since intensive processing on the simulation side can introduce unrealistic time delays in the exchange of I/O data.

The above-described deficiencies of today's automation control simulations systems are merely intended to provide an overview of some of the problems of conventional systems, and are not intended to be exhaustive. Other problems with conventional systems and corresponding benefits of the various non-limiting embodiments described herein may become further apparent upon review of the following description.

SUMMARY

The following presents a simplified summary in order to provide a basic understanding of some aspects described herein. This summary is not an extensive overview nor is intended to identify key/critical elements or to delineate the scope of the various aspects described herein. Its sole purpose is to present some concepts in a simplified form as a prelude to the more detailed description that is presented later.

One or more embodiments of the present disclosure relate to an automation simulation system that leverages the I/O module configuration information within an industrial controller to provide direct communication between a plant simulation and the controller's I/O module instances. The simulation system can query a controller and retrieve information regarding the I/O module configurations therein. This can include identifying the I/O modules in use and their respective user-defined parameters (e.g., I/O point names, scale factors, operating ranges, signal types, disabled points, etc.). The simulation system can then access a directory service to retrieve generic I/O module profiles corresponding to the I/O modules in use. The simulation system customizes these generic I/O module profiles using the configuration information retrieved from the controller to yield an I/O connection pool that instructs the simulation how to communicate with the controller's various I/O points.

During simulation, a simulated I/O kernel leverages this I/O connection pool to exchange simulated I/O data with the I/O module instances in the controller rather than exchange data directly with the I/O data table. This more accurately simulates exchange of physical I/O signals, since the simulated I/O can be exchanged as raw values and processed by the I/O module configurations (e.g., scaled, range limited, etc.) as in the real-world system. Thus, the behaviors of the I/O modules associated with the control program being tested are incorporated into the simulation process.

In one or more embodiments, the simulation environment can be embodied on a simulation module that attaches to the controller's chassis and communicates with the controller via the backplane. In some such embodiments, the simulation can employ a CIP (Common Industrial Protocol) service that allows I/O messages to be packaged and transmitted across the controller backplane, which acts as a simulated network during validation.

In another aspect according to one or more embodiments, the simulation system can employ a synchronization mechanism that maintains synchronization between the respective controller and simulation clocks during program validation. This synchronization mechanism can employ a modified IEEE 1588 Precision Time Protocol (PTP) that compensates for inconsistent clock speeds by allowing the master clock designation to be dynamically adjusted based on an evaluation of the respective clock speeds.

The techniques for configuring simulation I/O described herein can also be implemented in cloud-based emulation clusters. In such embodiments, an emulation data exchange model can transform clone I/O of a virtualized controller in the cloud platform to conform to a standardized communication protocol that facilitates data exchange with between the virtualized controller's I/O and a cloud-based simulation of an industrial system.

To the accomplishment of the foregoing and related ends, certain illustrative aspects are described herein in connection with the following description and the annexed drawings. These aspects are indicative of various ways which can be practiced, all of which are intended to be covered herein. Other advantages and novel features may become apparent from the following detailed description when considered in conjunction with the drawings.

DETAILED DESCRIPTION

Figure 1:
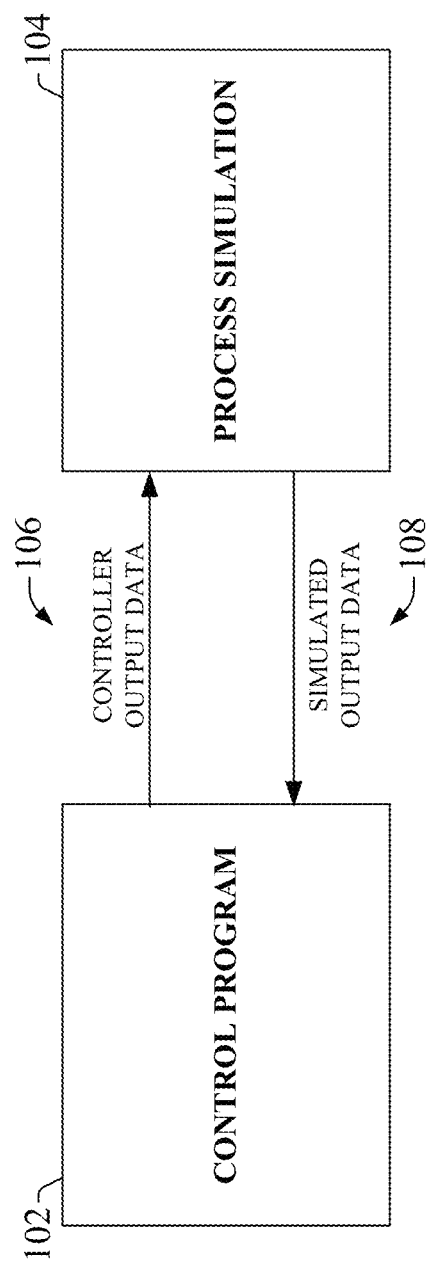
FIG. 1 is a high-level overview of the interactions between a control program under test and a simulation of a process to be controlled by the program.

The subject disclosure is now described with reference to the drawings, wherein like reference numerals are used to refer to like elements throughout. In the following description, for purposes of explanation, numerous specific details are set forth in order to provide a thorough understanding thereof. It may be evident, however, that the subject disclosure can be practiced without these specific details. In other instances, well-known structures and devices are shown in block diagram form in order to facilitate a description thereof.

As used in this application, the terms "component," "system," "platform," "layer," "controller," "terminal," "station," "node," "interface" are intended to refer to a computer-related entity or an entity related to, or that is part of, an operational apparatus with one or more specific functionalities, wherein such entities can be either hardware, a combination of hardware and software, software, or software in execution. For example, a component can be, but is not limited to being, a process running on a processor, a processor, a hard disk drive, multiple storage drives (of optical or magnetic storage medium) including affixed (e.g., screwed or bolted) or removably affixed solid-state storage drives; an object; an executable; a thread of execution; a computer-executable program, and/or a computer. By way of illustration, both an application running on a server and the server can be a component. One or more components can reside within a process and/or thread of execution, and a component can be localized on one computer and/or distributed between two or more computers. Also, components as described herein can execute from various computer readable storage media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry which is operated by a software or a firmware application executed by a processor, wherein the processor can be internal or external to the apparatus and executes at least a part of the software or firmware application. As yet another example, a component can be an apparatus that provides specific functionality through electronic components without mechanical parts, the electronic components can include a processor therein to execute software or firmware that provides at least in part the functionality of the electronic components. As further yet another example, interface(s) can include input/output (I/O) components as well as associated processor, application, or Application Programming Interface (API) components. While the foregoing examples are directed to aspects of a component, the exemplified aspects or features also apply to a system, platform, interface, layer, controller, terminal, and the like.

As used herein, the terms "to infer" and "inference" refer generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

In addition, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Furthermore, the term "set" as employed herein excludes the empty set; e.g., the set with no elements therein. Thus, a "set" in the subject disclosure includes one or more elements or entities. As an illustration, a set of controllers includes one or more controllers; a set of data resources includes one or more data resources; etc. Likewise, the term "group" as utilized herein refers to a collection of one or more entities; e.g., a group of nodes refers to one or more nodes.

Various aspects or features will be presented in terms of systems that may include a number of devices, components, modules, and the like. It is to be understood and appreciated that the various systems may include additional devices, components, modules, etc. and/or may not include all of the devices, components, modules etc. discussed in connection with the figures. A combination of these approaches also can be used.

To provide context for aspects of the present innovation, FIG. 1 illustrates a high-level overview of the interactions between a control program under test and a simulation of a process to be controlled by the program. Control program 102 can comprise any conceivable type of code used to process input signals read into a controller and to control output signals from the controller, including but not limited to ladder logic, sequential function charts, function block diagrams, or structured text. Control program 102 is designed to regulate a plant or an automation system therein. Process simulation 104 is a dynamic model representing the plant or automation system to be regulated by control program 102. Process simulation 104 mathematically models the system to be regulated by generating digital and analog I/O values representing, for example, sensor outputs, metering outputs, or other plant data analogous to the data expected to be generated by the physical system being modeled. This simulated output data 108 is provided to the control program, which receives this data as one or more virtual physical inputs. Control program 102 processes these inputs according to user-defined algorithms, and generates digital and/or analog controller output data 106 based on the processing. This output data 106 represents the physical outputs that would be generated by a controller executing control program 102 and transmitted to the hardwired field devices comprising the automation system (e.g., PID loop control outputs, solenoid energizing outputs, motor control outputs, etc.). The controller output data 106 is provided to the appropriate input points of the process simulation 104, which updates the simulated output data 108 accordingly. In this way, correct operation of control program 102 can be validated before deployment without the risk of damaging physical equipment.

Figure 2:
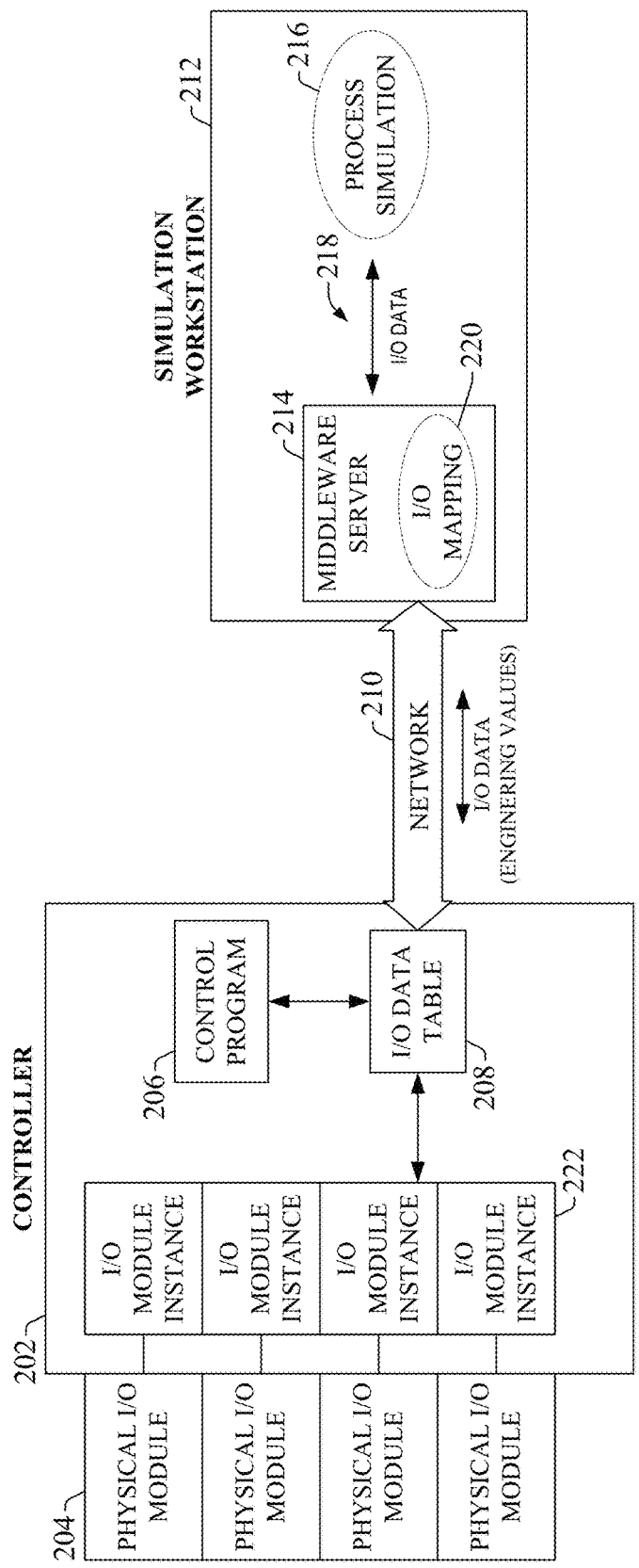
FIG. 2 is a block diagram of an exemplary conventional simulation configuration.

In some simulation scenarios, both the control program 102 and the process simulation 104 execute on a shared memory environment on a common workstation. In other cases, the control program 102 executes on an industrial controller, while the simulation runs on a separate workstation or computer and exchanges simulated I/O data with the controller across a network connection. In both of these simulation configurations, there are a number of non-deterministic layers between the process simulation and the control program. FIG. 2 depicts an exemplary simulation configuration that illustrates a number of drawbacks with conventional simulation techniques. Controller 202 can comprise, for example a programmable automation controller (PAC), a soft controller configured to execute on a personal computer, or other such controller, and can include one or more processors capable of executing control program 206. Control program 206 can comprise any conceivable type of code used to process input signals read into the controller 202 and to control output signals from the controller, including but not limited to ladder logic, sequential function charts, function block diagrams, or structured text.

Controller 202 can also include one or more physical I/O modules 204 that provide hardwired or networked connectivity to controlled equipment and telemetry devices comprising a controlled system. These I/O interfaces can include, for example, digital and/or analog input modules, digital and/or analog output modules, networking modules, or the like. An I/O data table 208 within the controller's memory can maintain the present analog and digital values of the various inputs and outputs read from or written to the I/O modules 204. That is, data values read from field devices by I/O modules 204 (e.g., analog or digital input modules) are written to the I/O data table 208. These input values are then read by control program 206, which updates its control variables accordingly. Similarly, output values generated by the control program 206 are written to I/O table 208, causing commensurate output data signals to be generated by the analog or digital output modules of I/O modules 204.

Figure 4:
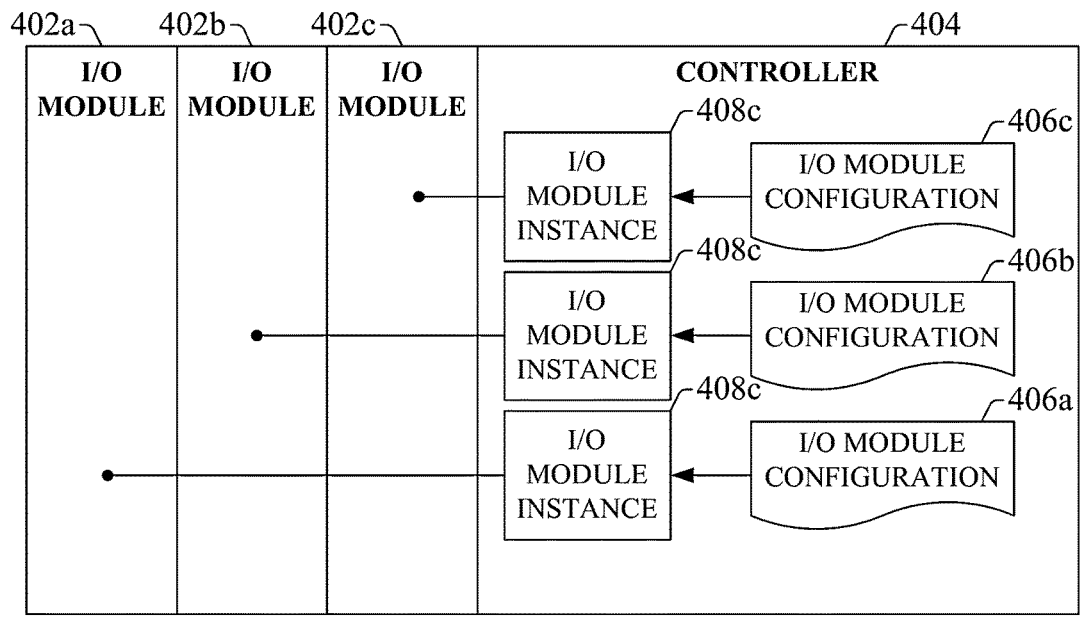
FIG. 4 illustrates the relationship between I/O modules, I/O module instances, and I/O module configurations.
Figure 5:
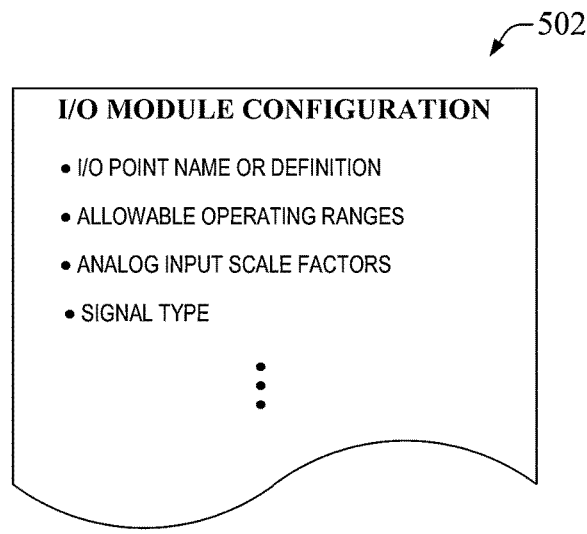
FIG. 5 illustrates an exemplary I/O module configuration.

Each physical I/O module 204 is associated with an I/O module instance 222 in the controller. These I/O module instances act as processing interfaces between their respective modules and the I/O data table 208, and process the I/O data in accordance with I/O module configurations associated with the respective modules. Turning briefly to FIGS. 4 and 5, the relationship between the I/O modules, I/O module instances, and I/O module configurations is described in more detail. Each I/O module 402a-402c attached to exemplary controller 404 has an associated I/O module configuration 406a-406c. Operational parameters associated with the I/O module configurations are configurable through the controller's programming interface. A number of possible configuration parameters for an exemplary I/O module configuration 502 are depicted in FIG. 5. Exemplary parameters that can be configured via the module configuration include, but are not limited to, the I/O point name, functional description, allowable operating ranges, analog input scale factors, or signal type. The I/O point names or descriptions can comprise, for example, labels, tag names, or textual descriptions associated with each point of the module. The allowable operating ranges can comprise permissible maximum and minimum values for signal data received or transmitted by each point of the module. Scale factors represent multipliers to be applied to received analog input data. For example, when an analog input signal is received at a physical I/O point on the module, the I/O module instance sees this signal as a raw value. The scale factor configured for the I/O point is then applied to the raw value to yield the value (typically in engineering units) used by the control program. The signal type defines the type of analog signal to be used for each point of an analog input or output module (e.g., 4-20 mA current signal, 0-10Vdc voltage signal, etc.).

Each I/O module 402a-402c depicted in FIG. 4 has a corresponding I/O module instance 408a-408c, which, as noted above, acts as an interface between its respective module and the I/O data table. Returning now to the exemplary conventional simulation system of FIG. 2, when the controller 202 is deployed in the field, the I/O module instances 222 process the I/O data received by or delivered to the physical I/O modules in accordance with the parameters defined in the I/O module configurations for the respective physical I/O modules. For example, when an analog input signal is received at a terminal of an analog input module (e.g., as a 4-20 mA signal, a 0-10Vdc signal, etc.), the controller sees this signal as a raw (unscaled) value. The I/O module instance associated with the analog input module applies a user-defined scale factor to this raw value to produce an engineering value, which is written to the I/O table 208 for processing by the control program 206. The I/O module instance can also enforce defined operating range limits on the input value, or perform other type of processing on the input data in accordance with the I/O module configuration associated with the input module. Similarly, when the control program 206 generates an output value to be transmitted to a device via an analog output module, the program typically writes the value to the address in the I/O data table 208 corresponding with the target output module point. The control program writes this value to the I/O data table 208 in engineering units, and the I/O module instance associated with the output module converts this engineering unit to an appropriate raw value used by the output module to generate the appropriately scaled output signal. As with the input module, the I/O module instance associated with the output module can apply appropriate user-defined processing on the output value in accordance with the I/O module configuration associated with the output module.

On the simulation side, process simulation 216 executes on a simulation workstation 212, which can be general-purpose computer, laptop, or other suitable platform. Process simulation 216 is an interactive algorithmic model of a physical automation system or plant to be regulated by control program 206. Simulation 216 generates digital and/or analog I/O data corresponding to physical I/O points in the real-world automation system, based in part on digital and/or analog output data provided to the simulation 216 by control program 206. In the present example, controller 202 and simulation workstation 212 communicate over a network 210 (e.g., Ethernet). Since process simulation 216 takes the place of the physical automation system for the purposes of program validation, I/O data that would otherwise be exchanged with physical equipment and devices via the physical I/O interface(s) 204 is instead exchanged with the simulation via network 210. For example, output data generated by control program 206 is written to the I/O table 208 in the normal fashion; however, instead of being processed by the I/O module instances 222 and transmitted via physical I/O modules 204 to field devices, the output values are read into the process simulation 216 via network 210. Likewise, data values representing inputs to the controller 202 are written to the I/O table 208 across network 210 for processing by control program 208. Thus, the I/O module instances 222, and their associated I/O module configurations, are effectively bypassed during simulation using the conventional simulation methods illustrated in FIG. 2.

In order to link the I/O points of process simulation 216 with the appropriate registers of I/O table 206 in the controller 202, a middleware server 214 is often employed as an intermediate layer through which the simulation and the controller exchange data. Middleware server 214 can comprise, for example, an OPC (Object Linking and Embedding for Process Control) server that includes an I/O mapping 220 defining the communicative associations between I/O points in the simulation 216 and I/O data table registers in the controller 202. I/O data generated by the simulation 216 to be sent to controller 202 is first written to the middleware server 214, which then writes the data to the appropriate register(s) in I/O data table 208 in accordance with I/O mapping 220. In the reverse direction, middleware server 214 monitors the I/O table registers specified by I/O mapping 220, detects changes to the values therein, and retrieves the modified values for delivery to simulation 216.

The presence of the middleware layer between the controller and the simulation introduces a number of problems. For one, fidelity of the I/O data generated by the simulation is compromised, since the data must pass through at least one additional layer prior to being received at the controller. The middleware layer also introduces additional transmission latency, thereby adversely affecting data update rates between the controller and the simulation. Moreover, operations of the operating system running on the simulation workstation 212 can sometimes interfere with the execution of simulation 216, thereby exacerbating these transmission delays. Moreover, the configuration depicted in FIG. 2 lacks the ability to synchronize the execution times of the control program and the simulation. Such synchronization would allow the system to more accurately represent the physical system by rendering response times more representative of real-time operation.

Moreover, as noted above, the simulation configuration depicted in FIG. 2 does not take into consideration the I/O module configurations associated with the physical I/O modules. Instead, the simulated I/O data is exchanged via a direct connection between the controller's I/O table 208 and the process simulation 216, thereby leaving the I/O module instances and their associated I/O module configurations out of the simulation scenario. In some cases, the I/O module configurations must even be disabled or neutralized to allow simulated I/O values to be written to the I/O modules' I/O data table registers by the middleware server without being overwritten by the I/O module instances. The validation is therefore rendered less accurate, since the role of the I/O module configurations has been omitted from the simulation procedure. After the validation phase, the I/O topology needs to be reattached to the control program to revalidate the solution with the real I/O. Thus, there is a need to merge these two validation steps into one.

Figure 3:
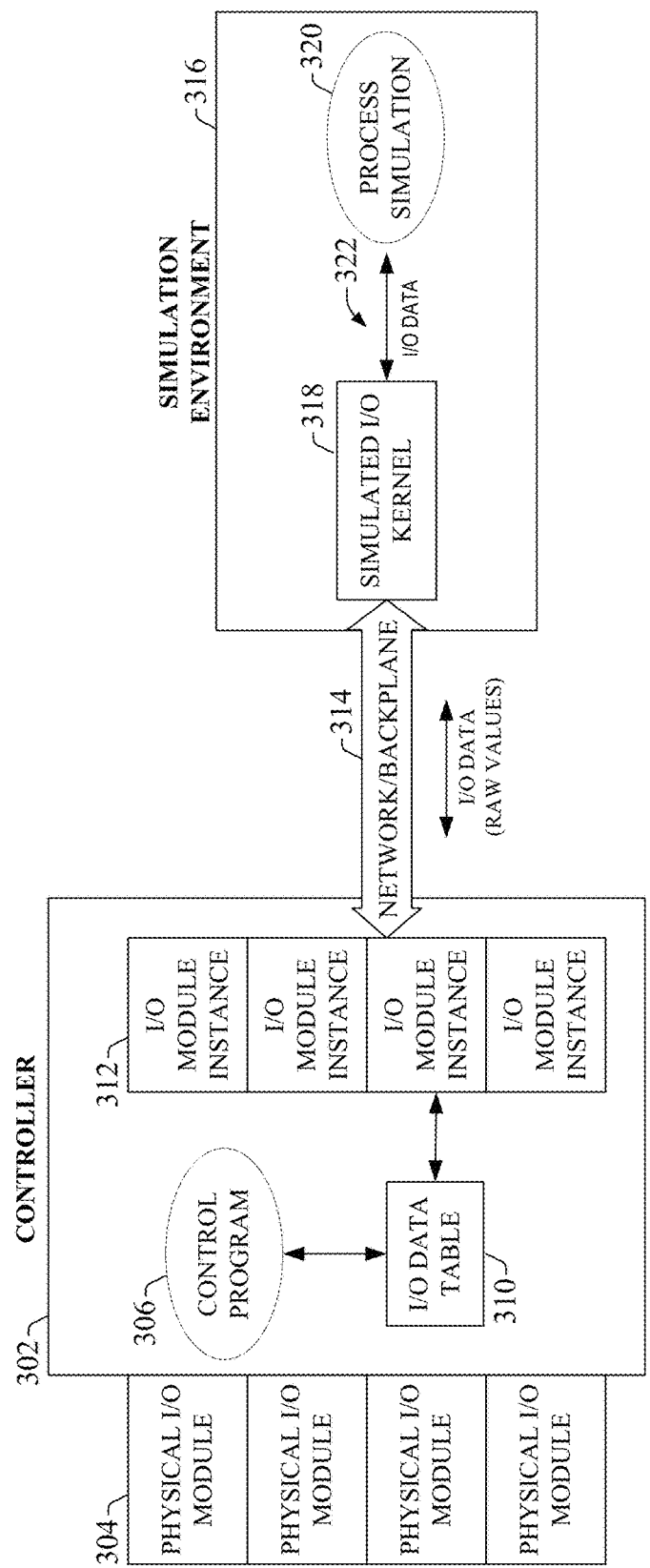
FIG. 3 is a block diagram of a simulation system that exchanges simulated I/O data with the I/O module instances in a controller.

FIG. 3 illustrates an improved simulation system for validating a control program according to one or more embodiments of the present disclosure. Controller 302 is similar to controller 202 of FIG. 2. As with the conventional system depicted in FIG. 2, process simulation 320 running in simulation environment 316 models an automation system or plant to be regulated by control program 306. Simulated I/O data is exchanged between controller 302 and the simulation environment 316 over a network or backplane. However, rather than employing a middleware layer to inject simulated I/O data directly to the controller's I/O data table 310 and read I/O data out of the data table, a simulated I/O kernel 318 facilitates exchange of simulated I/O data with the I/O module instances 312 themselves, thereby more accurately replicating transmission and receipt of physical input and output signals in a real-world system. For example, an analog value generated by the process simulation 320 representing a telemetry value (e.g., a motor speed value) can be written by the simulated I/O kernel 318 to the I/O module instance associated with analog input module designated to receive this telemetry signal. Unlike the configuration depicted in FIG. 2, in which the simulated I/O values must be written to the I/O table as prescaled engineering units, the simulated I/O kernel can provide the telemetry value to the appropriate I/O module instance as a raw analog value as it would be read from the analog input module when an analog input signal is applied (e.g., a 4-20 mA signal, a 0-10Vdc signal, etc.). The I/O module instance can then apply the user-defined scale factors, range limits, or other processing to the raw value as though the raw value provided by the simulation were a physical signal received at the corresponding input point of the analog input module. This processed input value is then written to the I/O data table 310 for processing by control program 306.

Similarly, an output value generated by the control program 306 (representing, for example, a speed control output to be transmitted to a variable frequency drive as a 4-20 mA signal) can be written to the I/O data table register corresponding to the appropriate output module point. In accordance with normal controller operation, this value is provided to the I/O module instance for processing in accordance with a user-defined I/O module configuration. However, rather than (or in addition to) generating the analog output signal on the output module terminal, the simulated I/O kernel 318 of the simulation environment is able to read the processed output value from the I/O module instance and provide this value to the process simulation 320.

By virtue of the techniques described above, one or more embodiments of the simulation environment described herein provide for redirection of the I/O module instances 312 to the simulation environment 316, such that the I/O module instances exchange raw I/O data, not only with their corresponding physical I/O modules 304, but also with simulated I/O kernel 318 in the simulation environment 316 (and thereby with process simulation 320). These aspects provide a number of advantages over the conventional configuration depicted in FIG. 2. For example, the I/O module instances 312 and their associated I/O module configurations need not be disabled or omitted from the simulation process, but rather are allowed to carry out their normal signal processing functions during simulation. In this regard, the simulated I/O data values received from the simulation 320 are treated as raw analog signals that are processed by the I/O module instances prior to being moved to the I/O data table, rather than being injected directly to the I/O data table by the simulation as pre-scaled engineering units. Redirection of the I/O module instances 312 also mitigates the additional configuration work required to disable or remove the I/O module configurations during simulation, which is sometimes necessary when writing data directly to registers in the I/O data table corresponding to physical I/O points. Using this simulated I/O model, a higher fidelity control simulation environment can be achieved to better approximate the real-world scenario.

Figure 6:
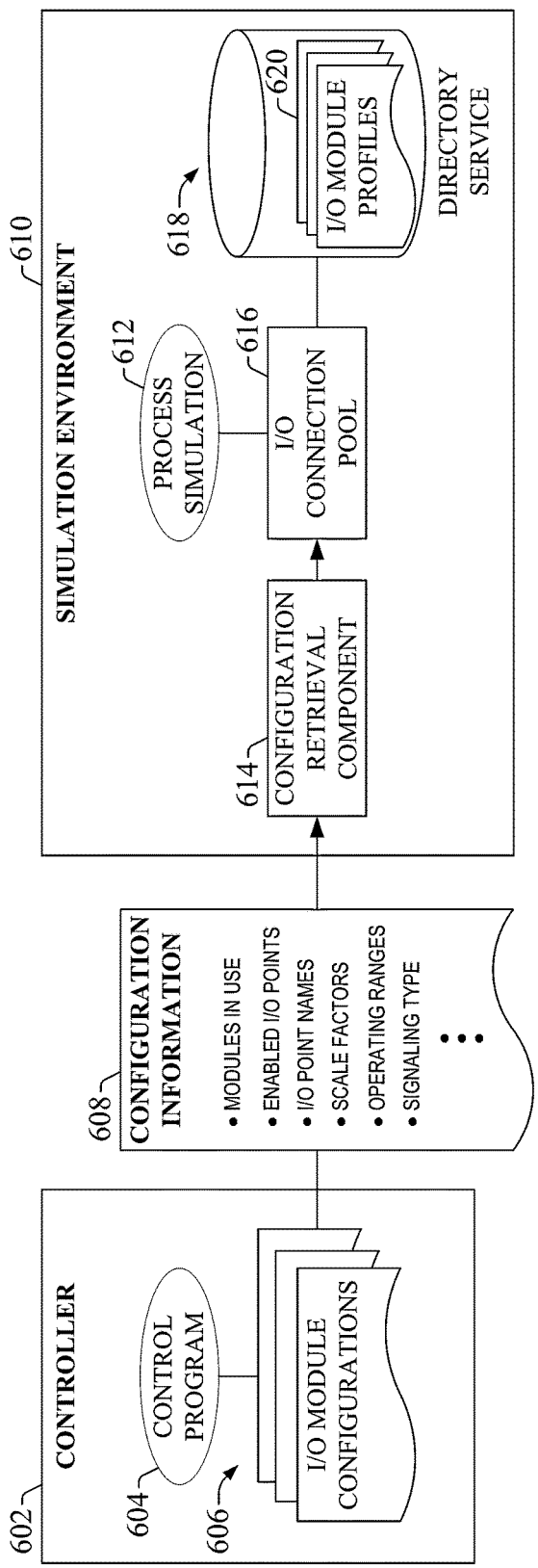
FIG. 6 illustrates an exemplary system for creating an I/O connection pool in a simulation environment.

In order to link I/O points in the process simulation with the appropriate points of the I/O module instances in the controller, the simulated I/O kernel in the simulation environment must be provided with instructions regarding how to connect with the I/O module instances. One or more embodiments of the simulation platform described herein can leverage the I/O module configuration information within the controller to create an I/O connection pool that can be used by the simulation developer to link I/O points between the simulation and the controller. FIG. 6 illustrates an exemplary system for creating this I/O connection pool. Controller 602 executes a control program 604 designed to control an industrial process. Control program 604 is to be validated using process simulation 612, which has been designed to simulate the industrial process to be regulated by control program 604. The controller 602 and simulation environment 610 can exchange data across any suitable communication means, including a physical network (e.g., Ethernet) or across a backplane of the controller's chassis (if the simulation environment is embodied on a controller module). As discussed above, control program 604 includes a number of I/O module configurations 606 that each correspond to an I/O module that will be employed by controller 602 and used to exchange I/O signaling with the industrial process.

Simulation environment 610 also includes a configuration retrieval component 614, which can query control program 604 to determine available I/O points configured for the program. To this end, configuration retrieval component 614 can access the I/O module configurations 606 and retrieve I/O point configuration information 608 based on the module configurations. Configuration retrieval component 614 is thus able to expose the I/O module configurations defined in the controller to the simulation environment 610, making the control program's defined I/O points available for selective association with the simulation's I/O points at design time. Configuration information 608 can include, for example, identification of the I/O modules in use, as well as the I/O points that are enabled for each I/O module and their associated user-specified I/O point names as defined in the module configurations. The configuration retrieval component can identify the enabled I/O points in a number of ways. For example, some I/O module configurations allow the programmer to individually set each point of an I/O module as being ENABLED or DISABLED. This information can be read by configuration retrieval component 614 to determine the active status of each point. Alternatively, in one or more embodiments, the configuration retrieval component 614 can converse with the control program 604 itself to determine which I/O module points are referenced in the I/O module configuration for the specific control program. Other configuration information that can be retrieved by the configuration retrieval component 614 can include, but is not limited to, scaling factors, operating ranges, and signaling types defined for the respective I/O points. It is to be appreciated that the exemplary configuration information described above is not intended to be exhaustive, and that any appropriate I/O module or I/O point configuration information encoded within the I/O module configurations 606 can be retrieved by the configuration retrieval component 614. Also, the configuration retrieval component 614 need not retrieve all the configuration information discussed herein in order to remain within the spirit of the present invention.

After the configuration retrieval component 614 has retrieved the I/O point configuration information 608, this information is passed to an I/O connection pool 616. The I/O connection pool 616 leverages the configuration information 608 to make the controller's I/O points available to the process simulation 612. The I/O points can be presented in the simulation as I/O blocks that the simulation programmer can graphically manipulate to connect simulated data with a specific I/O connection point. In order for the simulated I/O kernel to learn the proper data structure mapping to use for communication with each I/O module instance in the controller, the I/O connection pool 616 retrieves one or more I/O module profiles 620 from a directory service 618. The I/O module profiles 620 are electronic data sheets describing the generic characteristic (e.g., module type, point count, communication characteristics, data processing functions, etc.) of the various I/O modules that are compatible with controller 602, where each I/O module profile represents a particular I/O module and can include, in some embodiments, a graphical face for the module. The I/O module profile corresponding to a given I/O module contains information that can be used by the simulated I/O kernel to communicate with a generic instance of the I/O module, making it possible for the I/O kernel to exchange data with the I/O module instance on the controller. Directory service 618 serves as a profile catalog that can be accessed by the I/O connection pool 616 to retrieve selected module profiles. Although the directory service 618 is depicted in FIG. 6 as being local to the simulation environment 610, it is to be appreciated that the directory service can also reside remotely at a central location accessible to multiple users. According to some such embodiments, the directory service can reside on a server accessible via the Internet, such that simulation environment 610 can remotely retrieve the necessary I/O module profiles over an Internet connection.

Figure 7:
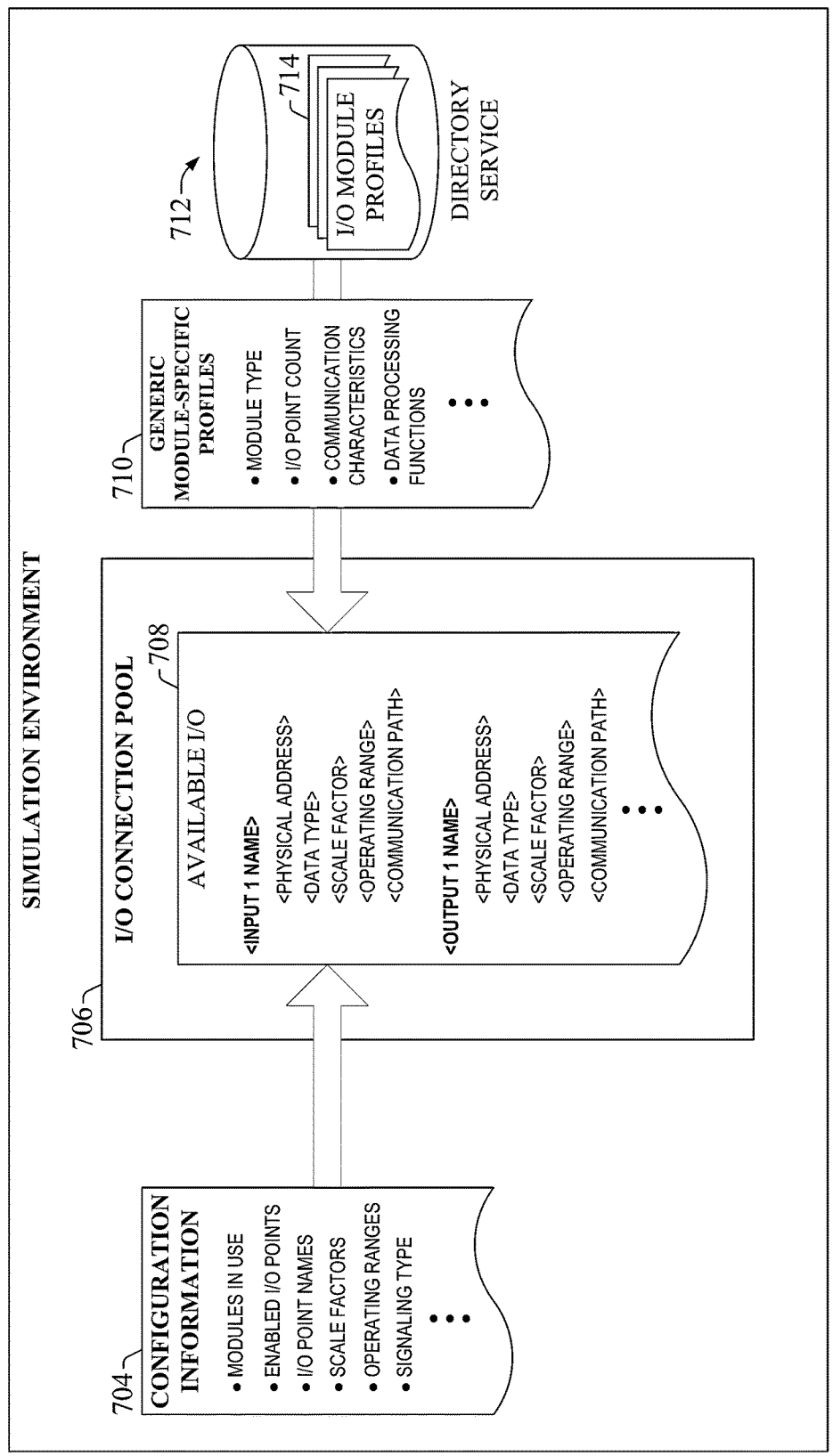
FIG. 7 illustrates creation of a pool of available I/O points using I/O module profiles and I/O module configuration information retrieved from a control program.

FIG. 7 illustrates how the simulation environment leverages these I/O module profiles and the retrieved configuration information to generate a pool of available I/O points for the process simulation. When the I/O connection pool 706 receives configuration information 704 from the configuration retrieval component, the I/O connection pool analyzes this information to identifying the I/O modules configured for use on the controller. The I/O connection pool 706 then accesses the directory service 712 and retrieves the subset of I/O module profiles 714 corresponding to the identified I/O modules. These retrieved I/O module profiles 710 can be thought of as generic representations of their corresponding I/O modules, which are then customized by the I/O connection pool using the user-defined, application-specific module configuration information 704 retrieved from the controller. The I/O connection pool thus processes the retrieved I/O module profiles 710 in view of the user-defined configuration information 704 to yield a listing of available controller I/O 708 that can be accessed by the simulation developer to create connections between the simulation's I/O points and the controller's available I/O.

The available controller I/O 708 listed in the I/O connection pool 706 can list each available input and output in the controller by its user-defined name or label, thus allowing the simulation developer to easily locate a desired I/O point for association with a given simulation I/O point. Each point of the available controller I/O 708 can also include application-specific configuration information for the point as determined from the configuration information 704, as well as the communication path and/or other information needed by the simulation to establish a connection with the I/O point of the I/O module instance in the controller.

Figure 8:
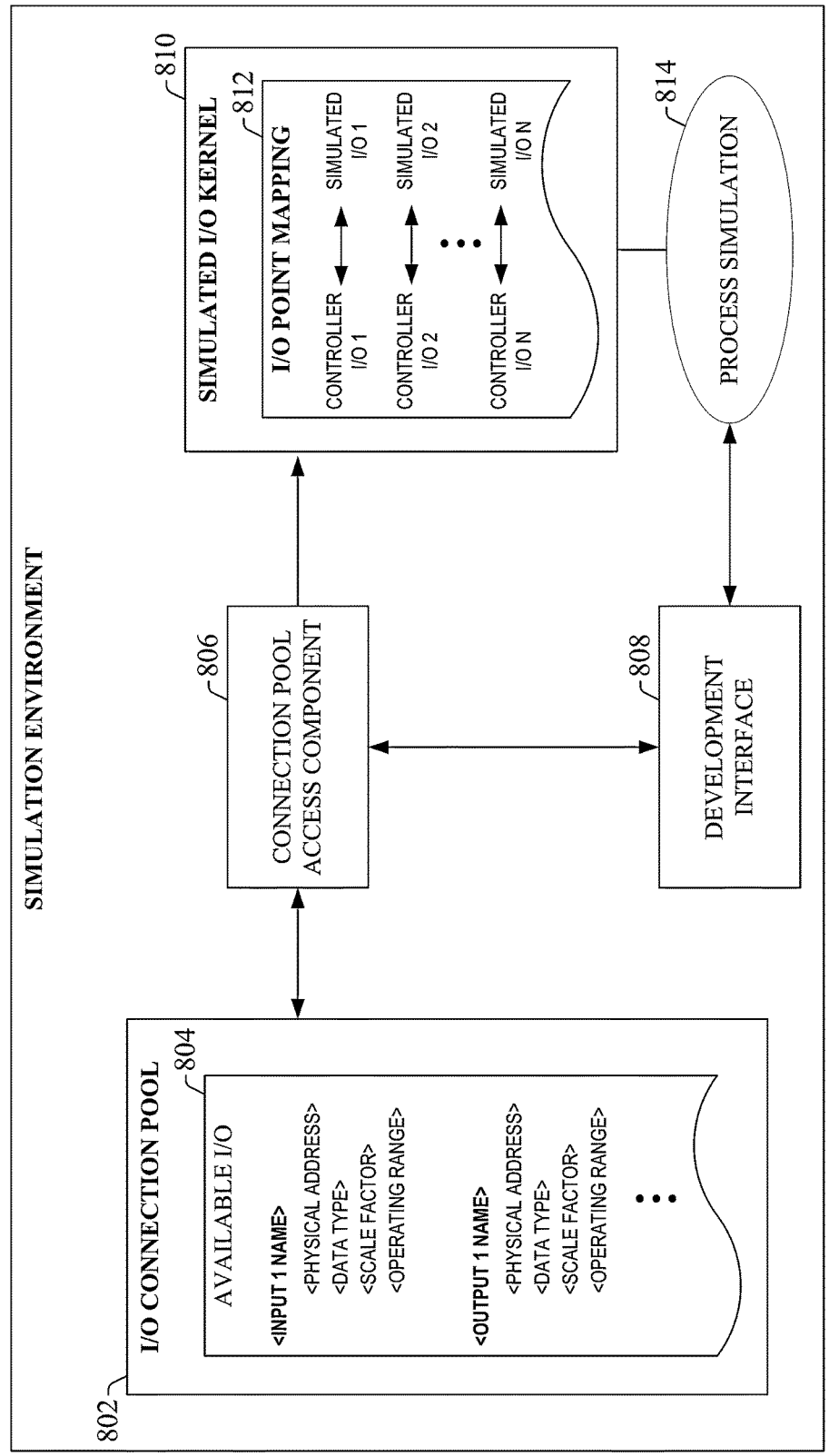
FIG. 8 illustrates creation of an I/O point mapping for a process simulation by drawing from an I/O connection pool.

FIG. 8 illustrates the process of creating an I/O point mapping for the process simulation by drawing from the I/O connection pool 802. A development interface 808 is provided through which a simulation developer can interact with the simulation environment to create a process simulation 814. The simulation environment also includes a connection pool access component 806 through which the development interface can access the I/O connection pool 802 as needed. The connection pool access component 806 makes the available controller I/O 804 visible to the development interface 808, allowing the developer to define linkages between simulated I/O points in the simulation 814 and controller I/O defined in the I/O connection pool 802. These defined linkages are encoded as an I/O point mapping 812, which can be used by the simulated I/O kernel 810 to exchange simulated I/O data with the controller. For example, the I/O point mapping 812 can instruct the simulated I/O kernel 810 that a particular analog output defined in the process simulation 814 (representing, for example, a tank level signal) is to be connected to a particular input point on a selected analog input module of the controller. When a value for this analog output is generated by the process simulation 814 during program validation, the I/O kernel 810 will provide this value to the appropriate I/O point of the I/O module instance corresponding to the selected analog input module in the controller. Likewise, when an analog output value generated by the control program is received at the simulation, the kernel 810 employs the mapping 812 to determine which input point of the simulation is to receive the data. Variations in the I/O configuration in the controller can be propagated to existing connecting pools to maintain I/O consistency. For example, a model update and verification action in the development interface 808 itself can dispatch warning messages for removing invalid I/O connectivity information.

Figure 9:
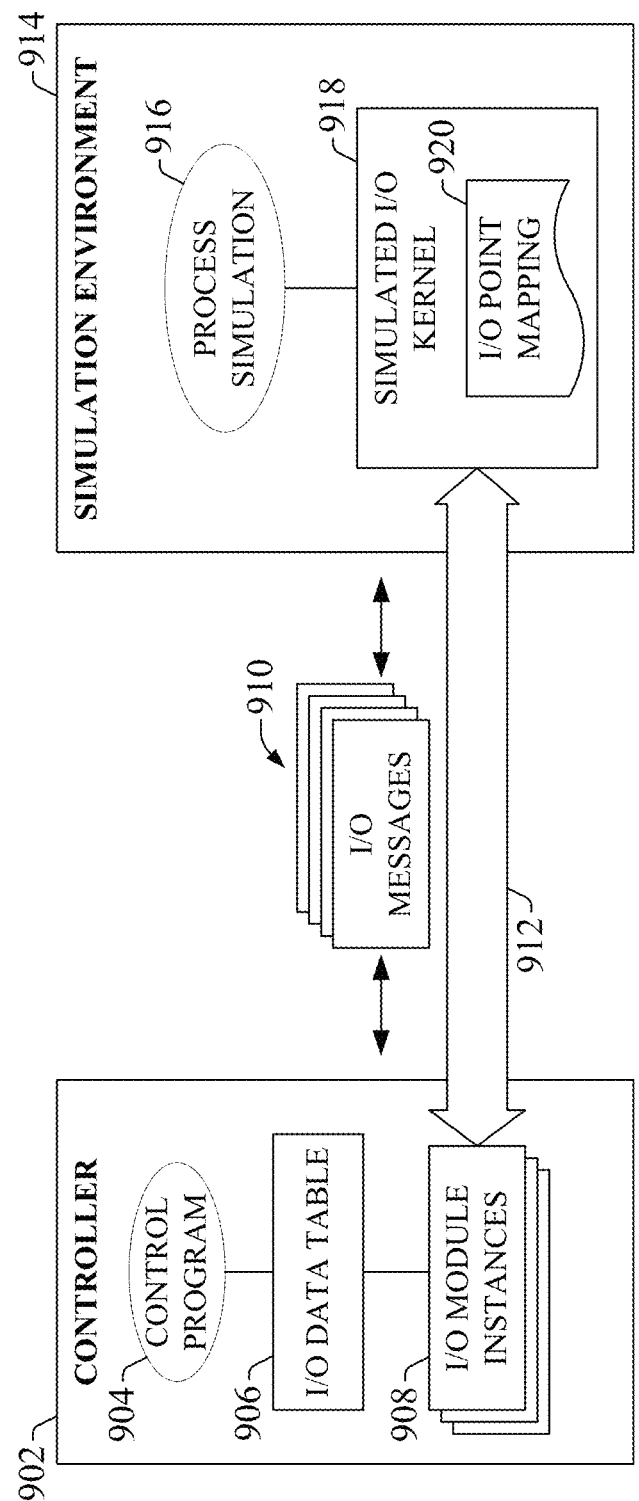
FIG. 9 illustrates exchange of I/O messages between a process simulation and the I/O module instances in a controller.

FIG. 9 further illustrates this exchange of I/O messages according to one or more embodiments. As described above, simulation environment 914 executes a process simulation 916 that emulates an industrial process to be controlled by control program 904 in controller 902. Rather than exchange simulated I/O data (in engineering units) with the controller 902 via a direct interaction with the controller's I/O data table 906, as with conventional simulation techniques, the simulated I/O kernel 918 allows I/O messages 910 to be exchanged with the controller's I/O module instances 908, affording the advantages discussed supra. The simulated I/O kernel references an I/O point mapping 920, similar mapping 812 described above in connection with FIG. 8, in order to properly map I/O points in the simulation 916 with I/O points of the I/O module instances in the controller. As noted above, exchanging simulated I/O data via the I/O module instances 908 rather than directly with the I/O data table 906 (e.g., via an OPC server) allows the I/O data to be exchanged as raw analog values rather than as preprocessed values, thereby more accurately emulating the real-world exchange of electrical control signals. By including the I/O module instances 908 and their associated I/O module configurations into the emulation process, the I/O module configurations themselves are incorporated into the control program testing, allowing the user-defined I/O point parameters, such as point scaling and operational limits, to be verified prior to deployment of the program. Moreover, the configuration depicted in FIG. 9 eliminates the need for a middleware layer to communicatively link simulated I/O with the data table, thereby improving the speed and accuracy of data communication with the controller.

Figure 10:
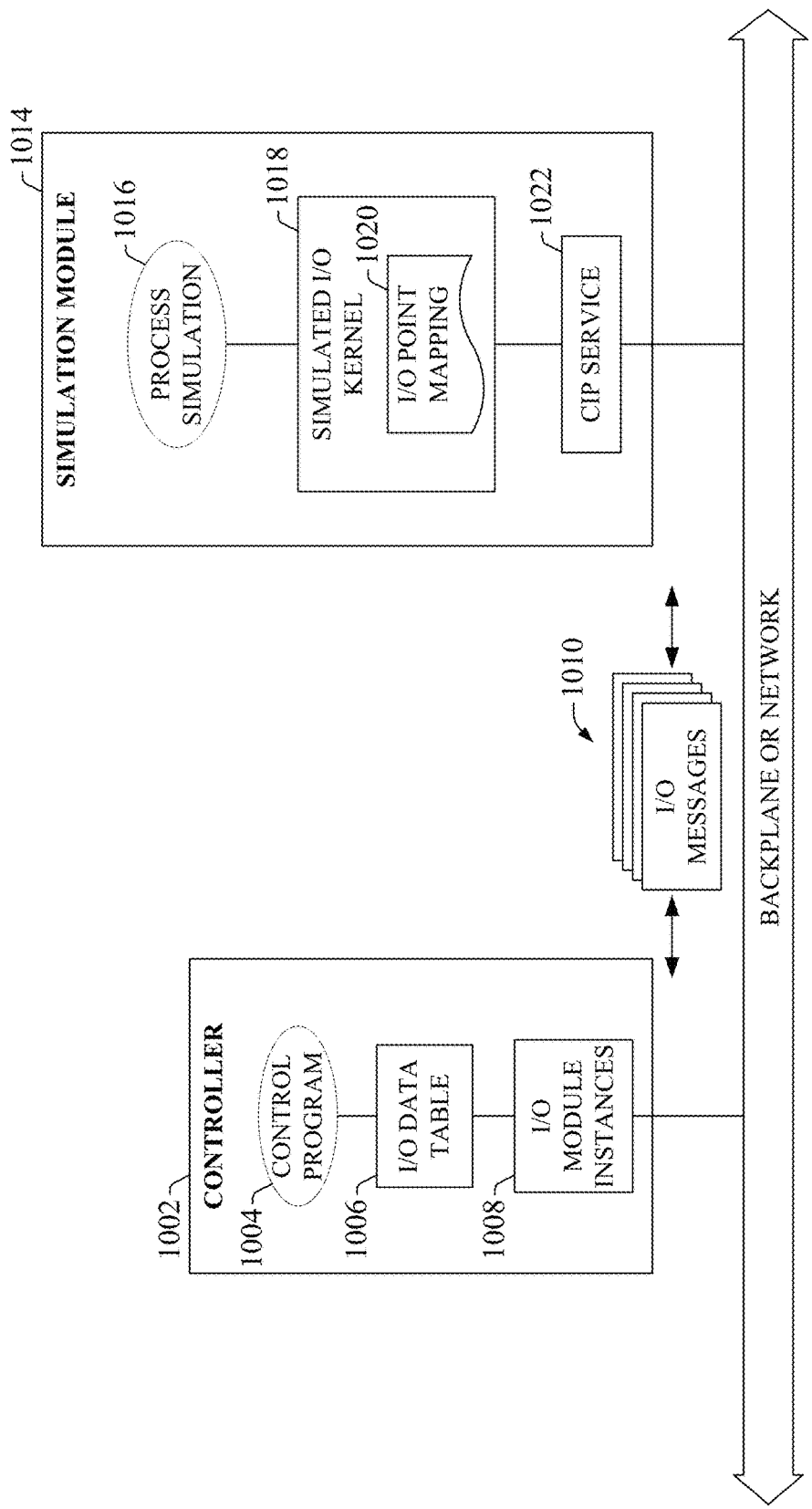
FIG. 10 illustrates a simulation system embodied as a simulation module that interacts with a controller over a backplane.

Any suitable communication means 912 can be used to connect controller 902 with the simulation environment 914 during simulation. In one or more embodiments, the simulation environment 914 can reside on a separate workstation that communicates with controller 902 over a network connection (e.g., Ethernet or other suitable networking standard). Alternatively, simulation environment 914 can be embodied on a dedicated simulation module configured to reside in an available I/O slot on the controller's chassis or on a shared control network with the controller. An example of such an embodiment is illustrated in FIG. 10. Controller 1002 executes control program 1004, similar to previous examples. Process simulation 1016 and simulated I/O kernel 1018, which includes I/O point mapping 1020, are similar to those described above. As in previous examples, the simulated I/O kernel 1018 exchanges simulated I/O data with the I/O module instances 1008, and thereby with control program 1004 via the I/O data table 1006. In this example, the simulation environment is embedded within a simulation module 1014 that exchanges I/O messages 1010 with the controller 1002 across the backplane of the controller's chassis (if the module is mounted locally in the controller's chassis) and/or across a control network on which controller 1002 resides. In one or more embodiments, this simulation module 1014 can be configured to reside in an available slot of the controller's chassis normally reserved for I/O or networking modules. Alternatively, the simulation module 1014 can reside on the controller network remotely from the controller. This allows I/O messages 1010 to be exchanged between the process simulation 1016 and the I/O module instances 1008 across the backplane 1012 of the chassis and/or control network.

One or more embodiments of simulation module 1014 can employ a Common Industrial Protocol (CIP) service 1022 to package the simulated I/O messages with a CIP protocol prior to transmission over the backplane or network. This effectively creates a simulated network across the backplane or network that connects the controller with the simulated I/O of the process simulation. Exchanging I/O messages as CIP packets can increase the speed of data transmission between the process simulation 1016 and the I/O module instances 1008 in the controller.

Figure 11:
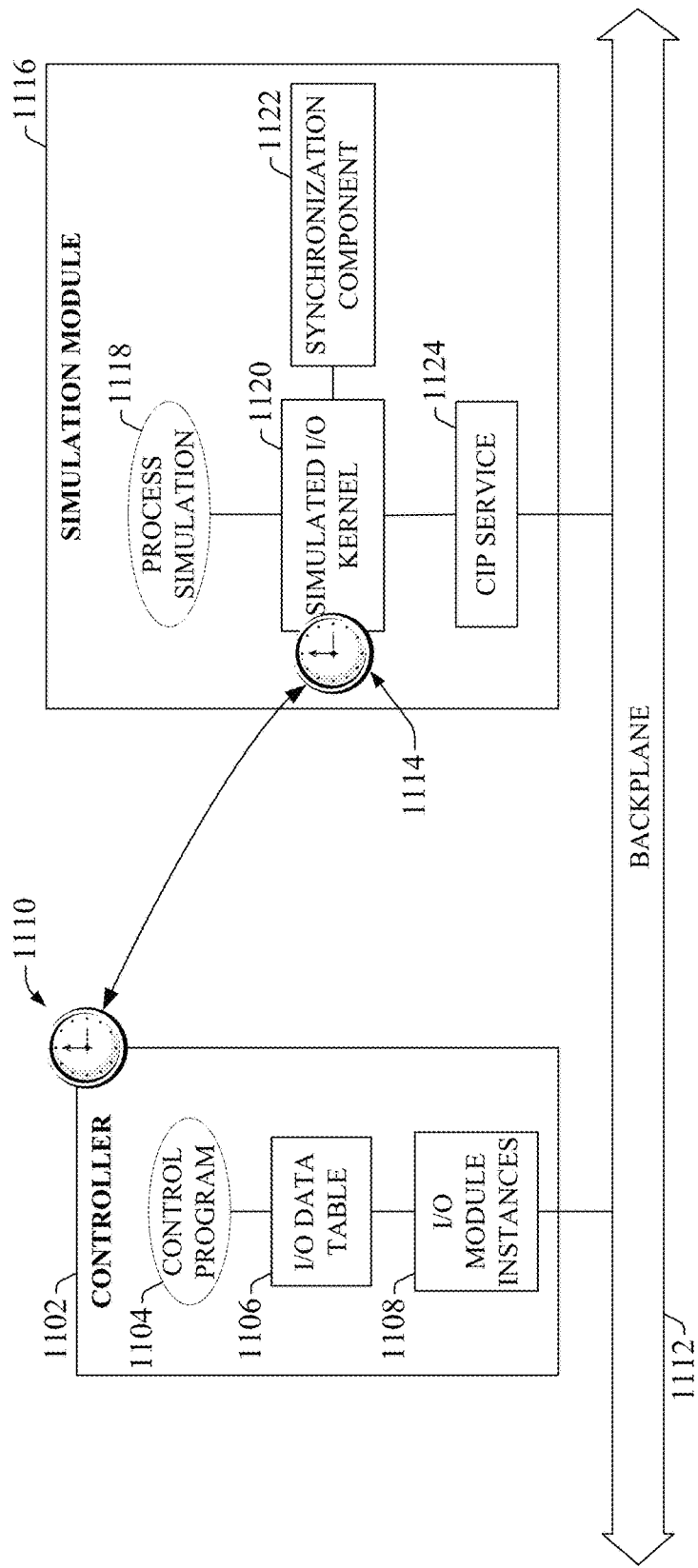
FIG. 11 illustrates an exemplary simulation system that includes synchronization functionality.

As noted above, one drawback of conventional OPC-based simulation configurations is the inability to synchronize the respective internal clocks of the simulation and the controller during validation. This can negatively impact the fidelity of the simulation, particularly since the heavy processing burden often seen on the simulation side can cause the simulation to execute more slowly than the controller, introducing undesirable delays in I/O data exchanges, unrealistic time stamps for simulated control (time critical) events, etc. Accordingly, one or more embodiments of the present simulation system can include the ability to synchronize execution of the controller and the simulation. FIG. 11 illustrates an exemplary simulation system that incorporates such synchronization functionality in accordance with one or more embodiments. The synchronization functionality depicted in FIG. 11 is described in connection with a module-based simulation system similar to that described above in connection with FIG. 10. As in previous examples, controller 1102 executes control program 1104, which writes output data to and reads input data from I/O data table 1106. Simulation module 1116 executes process simulation 1118, which exchanges simulated I/O data with the I/O module instances 1108 via simulated I/O kernel 1120 and CIP service 1124, as described supra. Simulation module 1116 can also include a synchronization component 1122 that maintains synchronization between the simulation clock 1114 and the controller clock 1110. Synchronization component 1122 can employ any suitable technique for maintaining synchronization between the controller and the simulation. For example, synchronization component 1122 can utilize an IEEE 1588 Precision Time Protocol (PTP), wherein controller clock 1110 is designated as a master clock, and the synchronization component adjusts the simulation clock 1114 to converge with the controller clock 1110.

Alternatively, one or more embodiments of synchronization component 1122 can employ a modified version of the IEEE 1588 PTP protocol, wherein the master clock designation can be changed dynamically as needed during the simulation. This modified 1588 PTP protocol is premised on the observation that the relative speeds of the two clocks 1110 and 114 may vary during simulation, and as such it is possible that a first clock may run faster than the second clock during a first execution step, while the second clock may be the faster clock during a subsequent execution step. This clock instability may be particularly pronounced given the heavy processing that may be required to execute the simulation 1118. Since it is generally preferable to designate the slower clock as the master, the modified 1588 PTP protocol implemented by one or more embodiments of the synchronization component 1122 can evaluate the respective clocks 1110 and 1114 at various times during simulation and dynamically select which clock is to serve as the master based on the evaluation. Selection of a master clock can be made, for example, based on a determination by the synchronization component 1122 of which clock was the slower clock during a most recent simulation execution step. The slower clock is then designated by the synchronization component 1122 to act as the master clock for the subsequent execution step. This modified 1588 PTP protocol is described in more detail in U.S. patent application Ser. No. 12/896,506, filed by the applicant on Oct. 1, 2010, and incorporated herein by reference.

Figure 12:
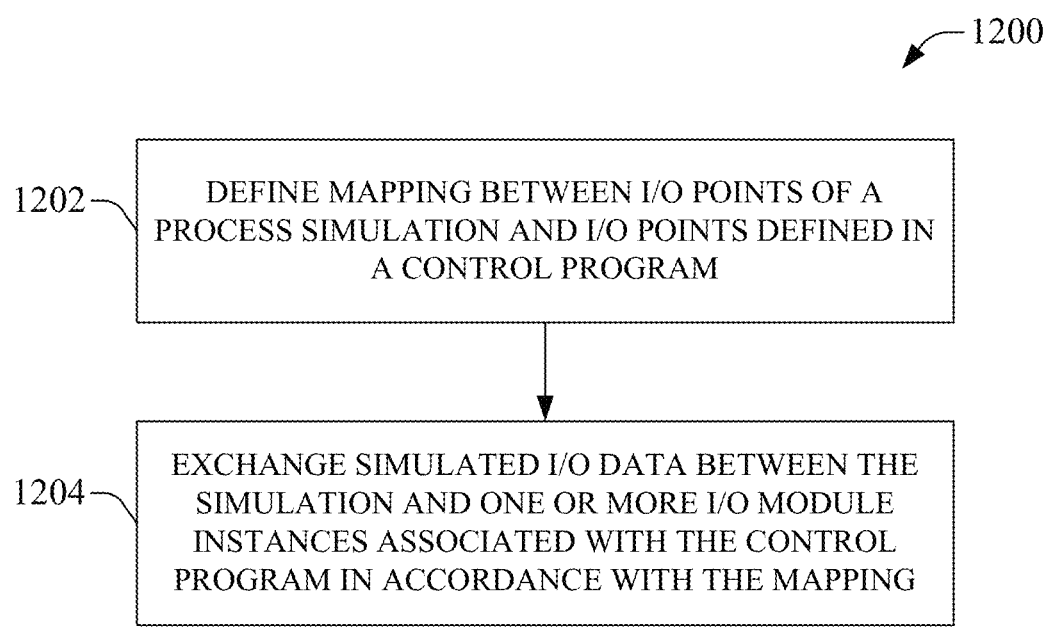
FIG. 12 is a flowchart of an example methodology for exchanging simulated I/O data between a process simulation and a control program under test
Figure 13:
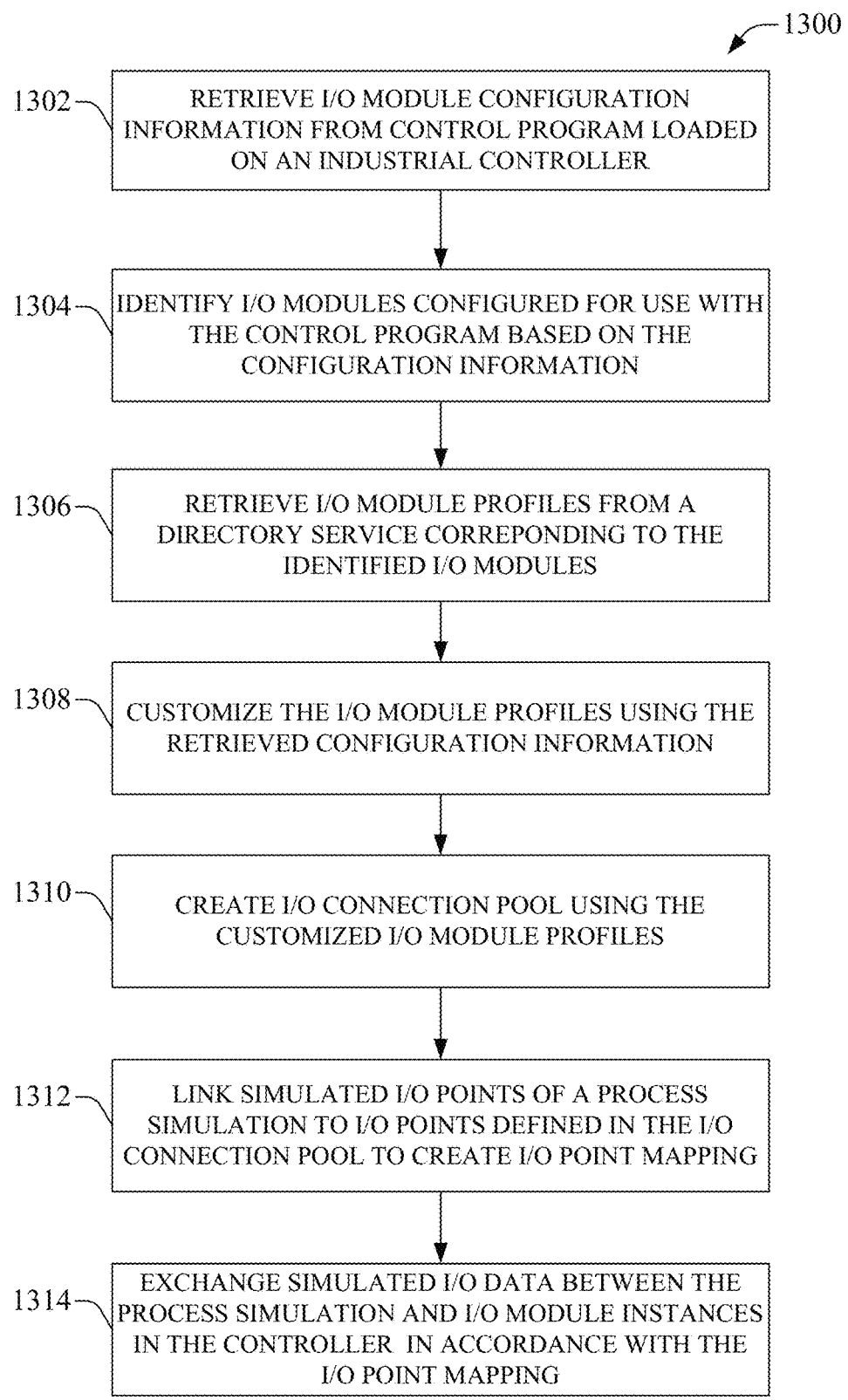
FIG. 13 is a flowchart of an example methodology for leveraging a control program's I/O module configurations to create an I/O connection pool.

FIGS. 12-13 illustrate various methodologies in accordance with one or more embodiments of the subject application. While, for purposes of simplicity of explanation, the one or more methodologies shown herein are shown and described as a series of acts, it is to be understood and appreciated that the subject innovation is not limited by the order of acts, as some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the innovation. Furthermore, interaction diagram(s) may represent methodologies, or methods, in accordance with the subject disclosure when disparate entities enact disparate portions of the methodologies. Further yet, two or more of the disclosed example methods can be implemented in combination with each other, to accomplish one or more features or advantages described herein.

FIG. 12 illustrates an example methodology 1200 for exchanging simulated I/O data between a process simulation and a control program under test. At 1202, a mapping is defined between I/O points of the process simulation and I/O points defined in the control program. This I/O point mapping can include communication path information for each defined controller I/O point informing the simulation how to communicate with the I/O module instances containing the respective controller I/O points. At 1204, simulated I/O data is exchanged between the simulation and the I/O module instances associated with the control program in accordance with the I/O point mapping. By exchanging I/O data with the I/O module instances, rather than via a direct OPC-based connection to the controller data table, the I/O module configurations defined in the control program are taken into account during the simulation process. Moreover, analog I/O data can be exchanged as raw values rather than as pre-scaled engineering units, rendering the simulated data exchange more representative of the I/O signaling that will be employed in the field after deployment of the control program.

FIG. 13 illustrates an example methodology 1300 for leveraging a control program's I/O module configurations to create an I/O connection pool that can be used by a simulation developer to create I/O point associations. At 1302, I/O module configuration information is retrieved from a control program loaded in an industrial controller. This I/O module configuration information can include such information as the I/O module types configured for use by the control program, identification of the available I/O points, I/O point scale factors and operational ranges, or any other suitable configuration information. At 1304, the I/O modules configured for use with the control program are identified through analysis of the retrieved configuration information. At 1306, one or more I/O module profiles corresponding to the identified I/O modules are retrieved. These I/O module profiles can be maintained, for example, in a directory service that acts as a catalog or library of available I/O module profiles. The profiles are generic but module-specific electronic data sheets containing characterizing information for their associated I/O modules (e.g., module type, point count, communication characteristics, data processing functions, etc.).

At 1308, the retrieved I/O module profiles are customized using the I/O module configuration information retrieved at step 1302. This step applies the user-defined parameters encoded in the module configuration information to the generic I/O module profiles, thereby transforming the profiles into analogous representations of the I/O modules configured for use by the control program. At 1310, an I/O connection pool is created using these customized I/O module profiles. This connection pool presents the controller's available I/O points to the simulation developer for selective association with the simulation I/O points. At 1312, simulation I/O points are selectively linked to available I/O points defined in the I/O connection pool to yield an I/O point mapping. At 1314, this I/O point mapping is leveraged by the process simulation to exchange simulated I/O data between the process simulation and I/O module instances in the controller.

Although the foregoing examples describe the simulation environment as exchanging simulated I/O data with a physical controller, the techniques described herein can also be used in cloud-based simulations that exchange simulated I/O with a virtualized controller instantiated in a cloud platform. For example, in a cloud-based simulation, controller 302 of FIG. 3 could be replaced with a virtualized controller that executes on a cloud platform. Similar to a physical controller, the virtualized controller can execute a control program to be tested through interaction with a system simulation also executing on the cloud platform. Instead of physical I/O modules, the virtualized controller is configured with virtual I/O modules that are analogous to the I/O modules of the corresponding physical controller being tested in the cloud. These virtual I/O modules are configured using I/O module configuration information (which may be similar to I/O module configuration 502 of FIG. 5). As with physical controllers, the I/O module configurations for virtual I/O modules define such information as I/O point names, analog scale factors and operating ranges, signal types, disabled points on each module, etc. A simulation environment similar to simulation environment 316 of FIG. 3 could also reside on the cloud platform. According to this cloud-based configuration, process simulation 320 can comprise a cloud-based machine simulation and simulated I/O kernel can exchange simulated I/O data with I/O module instances corresponding to the respective virtual I/O modules.

Figure 14:
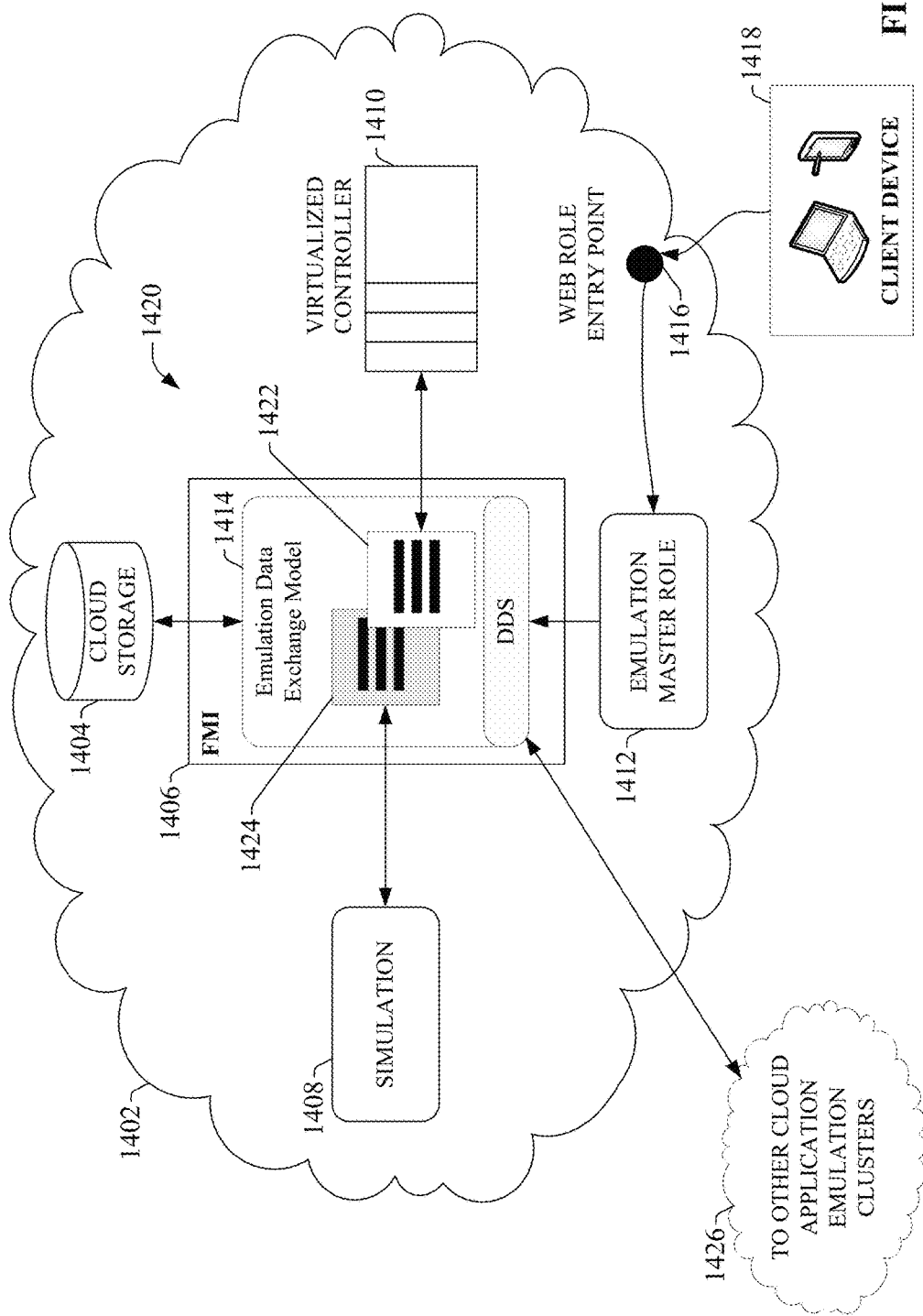
FIG. 14 is a block diagram of an example cloud-based platform for validating a virtualized controller using a machine or plant simulation executing on the cloud.

FIG. 14 is a block diagram of an example cloud-based platform for validating a virtualized controller using a machine or plant simulation executing on the cloud. In this example, a cloud application emulation cluster 1420 resides on cloud platform 1402. Cloud platform 1402 can be any infrastructure that allows cloud services to be accessed and utilized by cloud-capable devices. Cloud platform 1402 can be a public cloud accessible via the Internet by devices having Internet connectivity and appropriate authorizations to utilize the services. In some scenarios, cloud platform 1402 can be provided by a cloud provider as a platform-as-a-service (PaaS), and the cloud application emulation cluster 1420 can reside and execute on the cloud platform 1402 as a cloud-based service. In some such configurations, access to the cloud platform 1402 and the cloud application emulation cluster 1420 can be provided to customers as a subscription service by an owner of the cloud platform 1402. Alternatively, cloud platform 1402 can be a private or semi-private cloud operated internally by an industrial enterprise, or a shared or corporate cloud environment. An example private cloud can comprise a set of servers hosting the cloud application emulation cluster 1420 and residing on a corporate network protected by a firewall.

Cloud application emulation cluster 1420 includes a functional mock-up interface (FMI) 1406, which facilitates data communication between simulation 1408 and virtualized controller 1410. FMI 1406 standardizes communication between virtualized controller 1410 and simulation 1408 by encapsulating real I/O associated with a physical controller into clone I/O on the cloud, and normalizing the clone I/O according to a communication standard that facilitates data exchange with simulation 1408. In this way, FMI 1406 eliminates the need for a third-party API in order to exchange data between third-party simulations and a virtual controller.

Figure 15:
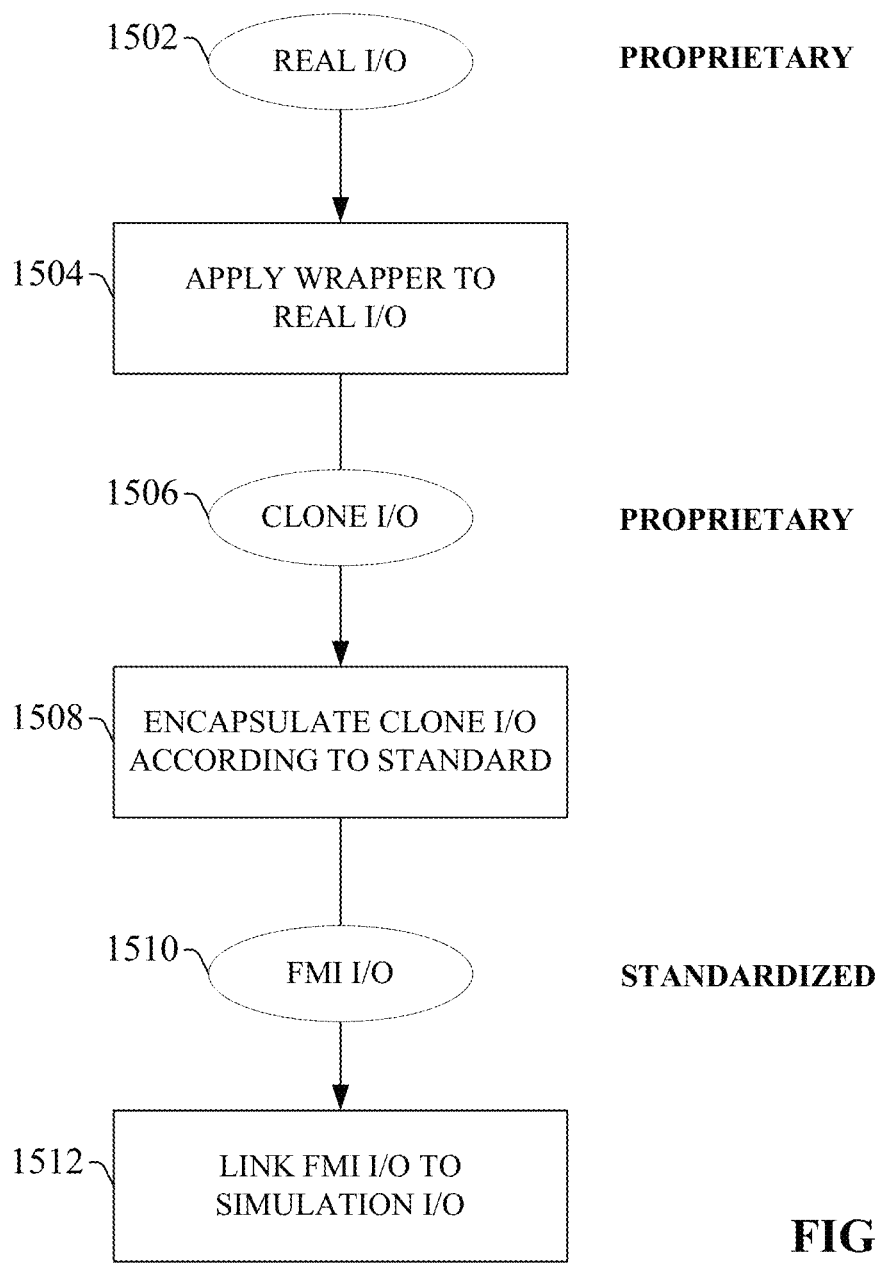
FIG. 15 is a functional mockup interface (FMI) workflow for normalizing and linking controller I/O in a cloud-based emulation.

Turning briefly to FIG. 15, an FMI workflow for normalizing and linking controller I/O is illustrated. Real I/O 1502 represents I/O of a physical controller being virtualized in the cloud platform, and can comprise, for example, I/O module configuration information (e.g. I/O module configuration 502 of FIG. 5) retrieved from the physical controller and migrated to the cloud platform The real I/O can define the I/O modules configured for use in the physical controller, the I/O points that are enabled for each I/O module and their associated user-specified I/O point names as defined in the module configurations, operating ranges and scale factors for each analog I/O point, and other such information. The real I/O 1502 may be in a proprietary format specific to the vendor and/or model of the physical controller. At 1504, the FMI 1406 applies wrapper information to the real I/O 1502 received from the physical controller to yield clone I/O 1506 on the cloud platform. The clone I/O 1506 represents virtualized I/O on the cloud platform corresponding to the real I/O of the physical controller. At this stage, clone I/O 1506 is still in the proprietary format corresponding to that of the real I/O 1502.

At 1508, the FMI 1406 encapsulates the clone I/O 1506 according to a standardized communication protocol to yield FMI I/O 1510. Encapsulation of the FMI I/O normalizes the clone I/O 1506 according to the standardized communication protocol (e.g., data distributed service or other protocol), allowing the FMI I/O to exchange data with simulation 1408. At 1512, the FMI I/O 1510 is communicatively linked to selected I/O points of simulation 1408 to facilitate testing of the controller configuration and control program through interaction with simulation 1408.

In some embodiments, emulation data exchange model 1414 can retrieve I/O module configuration information (in the form of clone I/O) from virtualized controller 1410, and create an I/O connection pool of available I/O based on the configuration information, in a technique similar to that described above in connection with FIG. 7. In such embodiments, emulation data exchange model 1414 may retrieve generic module-specific profiles from cloud storage 1404, and customize these generic profiles based on the retrieved configuration information to yield the I/O connection pool. The connection pool comprises I/O point definitions corresponding to the available clone I/O of virtualized controller 1410. Emulation data exchange model 1414 encapsulates these I/O point definitions in the FMI 1406 according to a standardized communication protocol (e.g., data distributed service, or DDS), so that the resulting FMI I/O 1422 can be communicatively linked to simulation I/O 1424 of simulation 1408 without the need of a $3^{rd}$ party API.

In one or more embodiments, FMI 1406 can use DDS as the exchange protocol between virtualized controller 1410 and simulation 1408. However, other communication protocols are within the scope of one or more embodiments of this disclosure. The FMI 1406 includes an emulation data exchange model 1414 configured to encapsulate and normalize clone I/O of the virtualized controller 1410 to yield FMI I/O 1422. The FMI I/O represents standardized controller I/O corresponding to the virtualized controller's clone I/O. Emulation data exchange model 1414 can communicatively connect the FMI I/O 1422 to corresponding simulation I/O 1424 of simulation 1408. Thus, the emulation data exchange model 1414 performs a similar function to that of simulated I/O kernel 810 described above by mapping I/O points in the process or machine simulation 1408 with the appropriate FMI I/O points corresponding to I/O of the I/O module instances configured in the virtualized controller 1410.

A client device 1418 can interface with cloud application emulation cluster 1420 via a web role entry point 1416. Through an emulation master role 1412 that is part of the cloud application emulation cluster 1420, a user can monitor and configure aspects of the simulation environment, including but not limited to modifying the virtual controller's programming or configuration, modifying aspects of simulation 1408, selectively mapping FMI I/O 1422 of the virtualized controller 1410 to selected simulation I/O 1424 of simulation 1408 through interaction with the I/O connection pool (in a manner similar to that described above in connection with FIG. 8), starting and stopping simulation tests, retrieving and viewing simulation results, etc.

Emulation data exchange model 1414 can also leverage data stored on cloud storage 1404 in connection with encapsulating clone I/O, linking FMI I/O 1422 (encapsulated clone I/O) to simulation 1408, building simulation 1408, configuring virtualized controller 1410, or running simulations on the cloud platform 1402. For example, cloud storage 1404 may contain prebuilt control logic libraries containing control logic segments or blocks that can be imported into virtualized controller 1410. These control logic segments or blocks may be discrete units of programmed functionality corresponding to common control functions, and may be categorized in cloud storage 1404 according to industry type (e.g., automotive, food and drug, oil and gas, etc.), industrial application (motion control, batch processing, material handling, etc.), device to be controlled, or other relevant classification criteria. A user can access the cloud platform 1402 via client device 1418 and view the available control logic segments or blocks. The emulation master role 1412 allows the user, via client device 1418, to select and retrieve a desired control logic segment or block from the control logic library and import the selected control logic segment into virtualized controller 1410. Cloud storage 1404 may also contain prebuilt simulation libraries containing simulation blocks that can be used to build and configure simulation 1408.

The architecture depicted in FIG. 14 is scalable, allowing different cloud application emulation clusters residing on the same or different cloud platforms to be linked using any suitable data exchange and synchronization protocol. For example, the cluster residing on cloud platform 1402 can be communicatively linked to other cloud application emulation clusters 1426, allowing data to be exchanged and/or synchronized across the clusters. Connecting different emulation clusters can allow, for example, emulation of a distributed system comprising multiple sub-systems that are virtualized on different cloud platforms, or as separate emulation clusters on the same cloud platform.

The cloud application emulation cluster 1420 provides services for cloud-based industrial simulations at several different levels. For example, cloud platform 1402 serves as an infrastructure-as-a-service (IaaS) for industrial I/O configuration (e.g., cloning and encapsulating controller I/O on the cloud, linking the encapsulated I/O to cloud-based simulation 1408); as a platform-as-a-service (PaaS) for industrial application configuration (e.g., development and testing of a controller program on virtualized controller 1410); and as a software-as-a-service (SaaS) for virtual design engineering.

Figure 16:
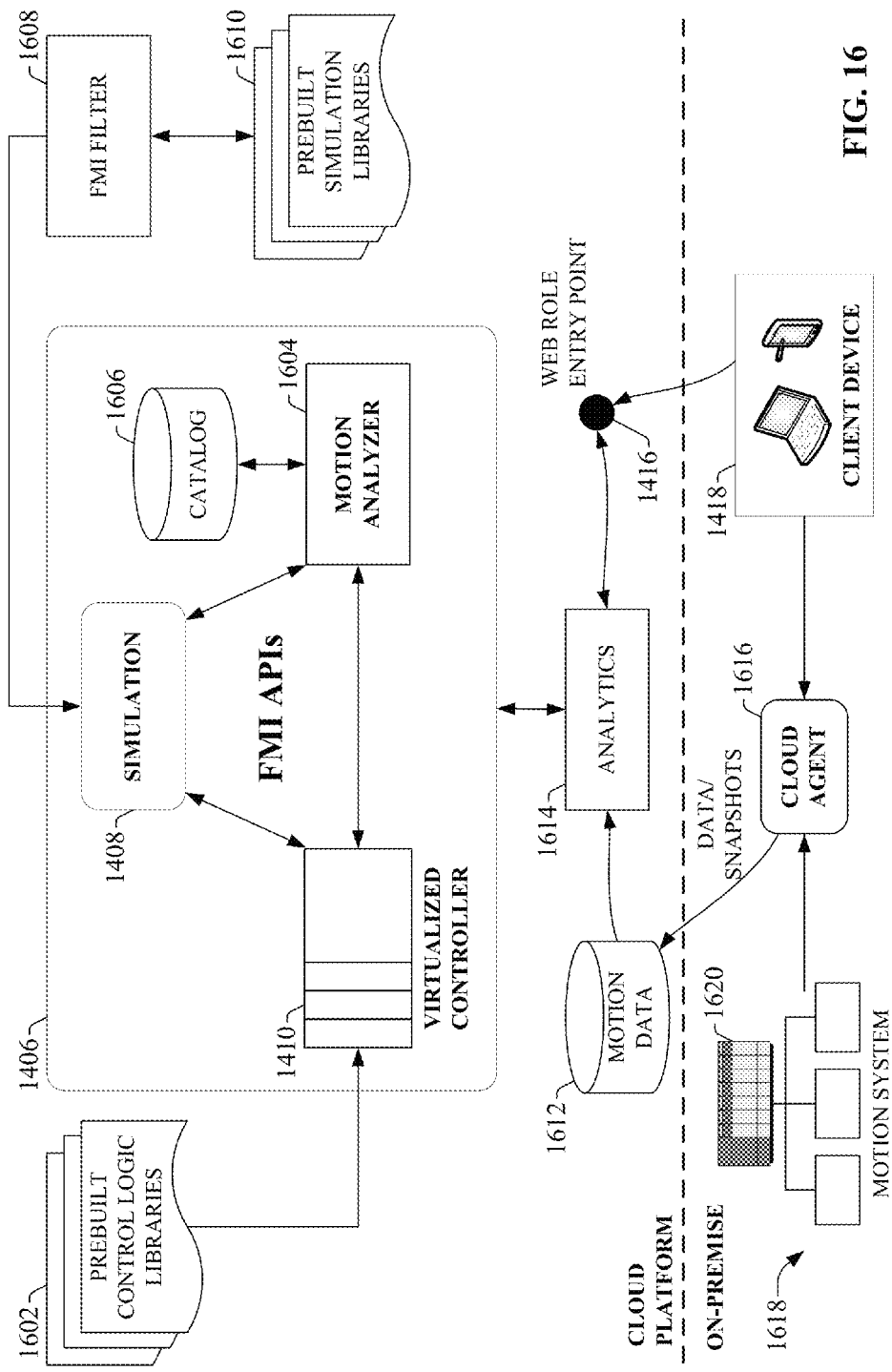
FIG. 16 is a block diagram illustrating simulation, testing, and model-based analytics of an example motion control system using a cloud-based FMI.

FIG. 16 is a block diagram illustrating simulation, testing, and model-based analytics of an example motion control system using cloud-based FMI 1406. A simulation 1408 that emulates a user's controlled motion system 1618 can be built in the cloud platform. Although FIG. 16 depicts simulation of a motion system in particular, it is to be appreciated that any type of industrial system can be emulated and tested on the cloud platform using FMI 1406. By interfacing client device 1418 to the cloud platform, a designer can leverage SaaS services supported by the cloud platform to build simulation 1408. In this regard, the designer's client device 1418 can interface with the cloud platform via a web role entry point 1416, and access prebuilt simulation libraries 1610 containing simulation building blocks. The prebuilt simulation libraries 1610 can include simulation building blocks representing devices (e.g., motors, motor drives, sensors, pumps, vats, etc.), machines, systems or sub-systems, or other blocks of automation system functionality that can be selectively integrated into simulation 1408 to yield an emulation of on-premise motion system 1618. The FMI an include an FMI filter 1608 that allows the designer to browse, sort, and/or filter the prebuilt simulation libraries 1610 according to any suitable criterion to facilitate identification of a desired simulation building block. The prebuilt simulation libraries may be stored, for example, on cloud storage 1404 illustrated in FIG. 14.

Clone I/O of virtualized controller 1410 is communicatively linked to simulation 1408 using techniques described above in connection with FIG. 14. Virtualized controller 1410 executes a control program to be tested using simulation 1408. In some embodiments, the cloud platform can support cloud-based system programming and design. To this end, the cloud platform may include prebuilt control logic libraries containing common controller code (e.g., ladder logic segments, sequential function charts, etc.) that can be selectively imported into virtualized controller 1410 for execution. The control logic libraries 1602 may organize the controller code according to industry type, industrial application, device or system being controlled, a type of control functionality, or other such criteria.

In order to generate simulation diagnostics, FMI 1406 can also include a motion analyzer 1604 that monitors the simulation 1408 and virtualized controller 1410 during a simulation sequence and generates motion control statistics and diagnostics for the simulation. For example, motion analyzer 1604 may generate response time information, frequency response curves, or other performance metrics of the emulated motion system under control of the virtualized controller 1410. Motion analyzer 1604 may leverage catalog information stored in catalog 1606 in connection with generating these performance statistics. For example, catalog 1606 may include specification and/or performance data for a range of devices, equipment, or materials being emulated by simulation 1408 (e.g., motor and motor drive specifications, rated inertia information for various mechanical systems, stiffness information for different coupling types and materials, etc.). Using this information, motion analyzer 1604 can estimate how the emulated mechanical system represented by simulation 1408 would respond to control outputs generated by virtualized controller 1410 in accordance with its control programming, and generate performance statistics and diagnostic information for a simulation test. Via client devices 1418, a designer can use the results generated by motion analyzer 1604 to determine whether the control program being executed by virtualized controller 1410, or aspects of the emulated mechanical system being controlled, should be modified in order to improve performance.

The architecture depicted in FIG. 16 can also facilitate direct connectivity between cloud-based analytics and time-series sensor data on the plant floor. In this regard, motion data collected from a motion system 1618 on the plant floor can be injected to the cloud platform for storage and analysis. This on-premise data can be used by the FMI 1406 in connection with cloud-side emulation of the actual plant system. In some embodiments, the motion data can be collected from motion system 1618 via an on-premise cloud agent 1616, which collects industrial data from plant-floor devices (e.g., industrial controllers, sensors, meters and other telemetry devices, drives, etc.) and transfers the data to a cloud repository for storage (e.g., in motion data storage 1612). Cloud agent 1616 is configured to collect the live or historical data from one or more industrial assets, either directly or by accessing data storage associated with a data concentrator that collects data from the assets. Cloud agent 1616 can execute on any suitable hardware platform (e.g., a server, a LINUX box, etc.), and acts as a generic gateway that collects data items from the various industrial assets comprising the motion system 1618 and packages the collected data according to a generic, uniform data packaging schema used to move the on-premise data to the cloud platform. Cloud agent 1616 provides a software mechanism to dynamically link on-premise-to-cloud gateways, and provides an expandable data type schema that allows new data types to be added without the need to redeploy the monitoring system to the cloud.

If the cloud platform is a web-based cloud, cloud agent 1616 at the industrial facility may interact with cloud services executing on the cloud platform directly or via the Internet. In an exemplary configuration, the industrial devices comprising the motion system 1618 connect to the cloud agent 1616 through a physical or wireless local area network or radio link. In another exemplary configuration, the industrial devices may access the cloud platform directly using integrated cloud agents. During data collection, cloud agent 1616 can intelligently sort and organize the data collected from motion system 1618 based on defined criteria, including but not limited to time of occurrence and/or user-defined priorities. Cloud agent 1616 can be, for example, a service (e.g., a Windows service) that periodically collects and transmits serialized and compressed data into the cloud domain using standard web services over HTTPS/SSL.

The cloud agent architecture—comprising cloud agent 1616 and cloud-side services that receive and process data from the agent—utilizes priority message queues and blob storage to decouple transmission of the collected data from processing and use of that data in the cloud platform. The cloud agents can also support torrential data streams and parallel pipes, resulting in high performance data transmission capability. In some embodiments, queue processing services on the cloud agent 1616 can package collected industrial data with customer-specific header information containing customer identification information, processing priority information specifying a relative priority for processing the data in the cloud platform (which may be based on a type of the data; e.g., historical, live, alarm, etc.), and other information that can be leveraged in the cloud platform to identify a type of processing to be performed on the data by the cloud platform's data process services.

Using the architecture described above, cloud agent 1616 can collect operational and/or configuration data from industrial assets comprising motion system 1618 and send the data to data processing services executing on the cloud platform, which organize and store the data on motion data storage 1612. Analytics services 1614 executing on the cloud platform can process the collected data and provide results to FMI 1406. For example, analytics services 1614 may analyze the motion data to determine frequency response information for closed-loop motion control systems, machine response times, device configuration information (e.g., variable frequency drive parameter settings), control loop tuning parameters, device or machine downtime statistics, alarm information, or other such operational and configuration information based on analysis of the on-premise data received from cloud agent 1616.

FMI 1406 can use results generated by analytics services 1614 to update one or more of the simulation 1408, virtualized controller 1410, or motion analyzer 1604 to yield a more accurate emulation of the on-premise motion system 1618. For example, virtualized controller 1410 may be an emulation of real controller 1620 of motion system 1618. In some embodiments, the cloud agent 1616 may monitor controller 1620 for programming and/or configuration changes (e.g., addition or removal of I/O modules, modification of analog I/O point scale factors, etc.) and provide notifications of these changes to the cloud platform. The FMI 1406 can then update virtualized controller 1410 accordingly so that the on-premise system is accurately emulated in the cloud platform for simulation purposes. Similarly, frequency response curve information, loop tuning parameters, response times, and other measured performance statistics for the motion system can be used by the FMI to update simulation 1408 to accurately reflect machine responses and device configurations of the real motion system 1618. Using this cloud-base architecture, the real on-premise motion system can be accurately mirrored on the cloud platform, allowing designer to run simulated test scenarios on the emulated system without putting the actual system at risk or consuming plant resources.

Embodiments, systems, and components described herein, as well as industrial control systems and industrial automation environments in which various aspects set forth in the subject specification can be carried out, can include computer or network components such as servers, clients, programmable logic controllers (PLCs), communications modules, mobile computers, wireless components, control components and so forth which are capable of interacting across a network. Computers and servers include one or more processors—electronic integrated circuits that perform logic operations employing electric signals—configured to execute instructions stored in media such as random access memory (RAM), read only memory (ROM), a hard drives, as well as removable memory devices, which can include memory sticks, memory cards, flash drives, external hard drives, and so on.

Similarly, the term PLC as used herein can include functionality that can be shared across multiple components, systems, and/or networks. As an example, one or more PLCs can communicate and cooperate with various network devices across the network. This can include substantially any type of control, communications module, computer, Input/Output (I/O) device, sensor, actuator, and human machine interface (HMI) that communicate via the network, which includes control, automation, and/or public networks. The PLC can also communicate to and control various other devices such as I/O modules including analog, digital, programmed/intelligent I/O modules, other programmable controllers, communications modules, sensors, actuators, output devices, and the like.

The network can include public networks such as the internet, intranets, and automation networks such as control and information protocol (CIP) networks including DeviceNet, ControlNet, and Ethernet/IP. Other networks include Ethernet, DH/DH+, Remote I/O, Fieldbus, Modbus, Profibus, CAN, wireless networks, serial protocols, and so forth. In addition, the network devices can include various possibilities (hardware and/or software components). These include components such as switches with virtual local area network (VLAN) capability, LANs, WANs, proxies, gateways, routers, firewalls, virtual private network (VPN) devices, servers, clients, computers, configuration tools, monitoring tools, and/or other devices.

Figure 17:
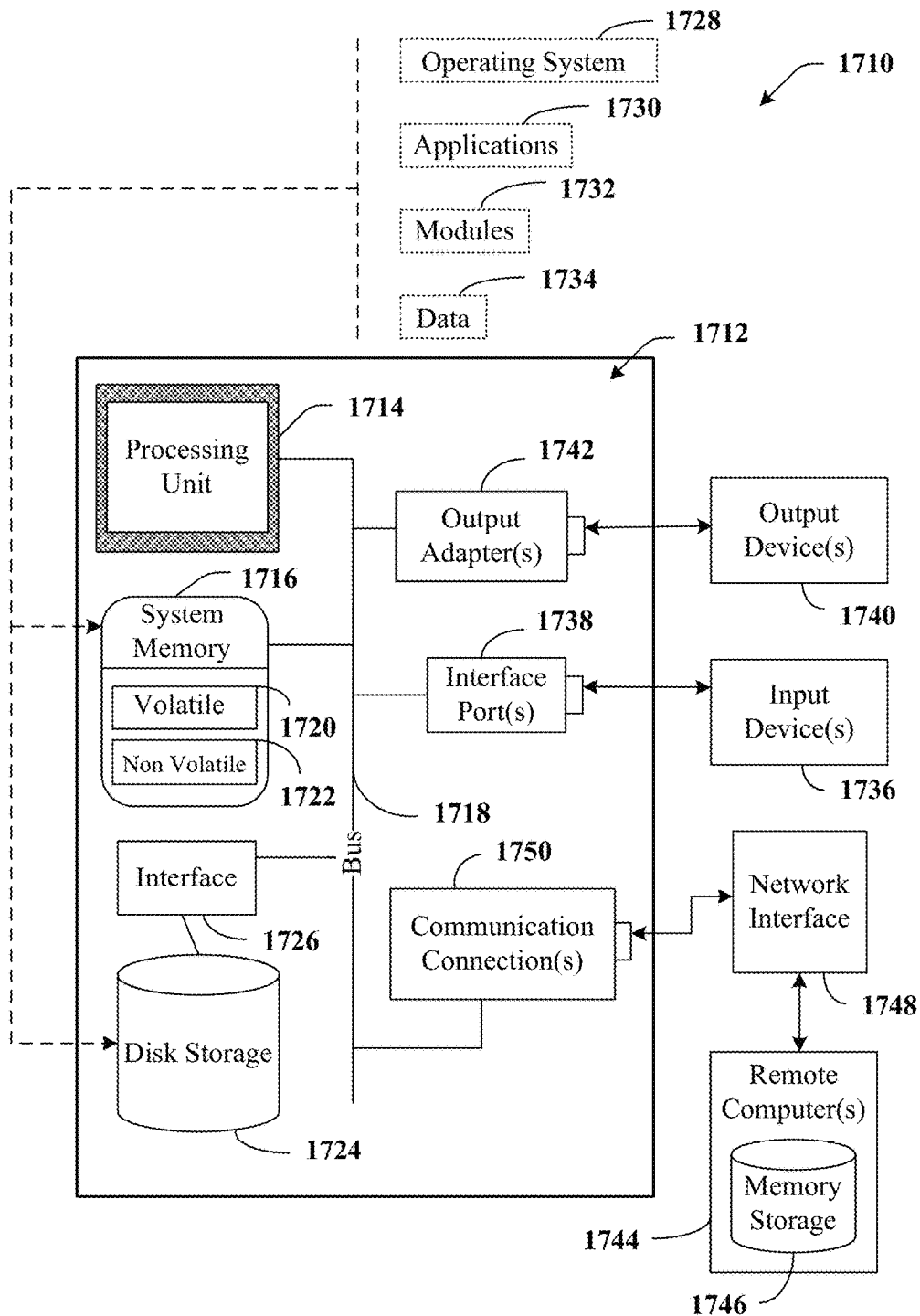
FIG. 17 is an example computing environment.

With reference to FIG. 17, an example environment 1710 for implementing various aspects of the aforementioned subject matter includes a computer 1712. The computer 1712 includes a processing unit 1714, a system memory 1716, and a system bus 1718. The system bus 1718 couples system components including, but not limited to, the system memory 1716 to the processing unit 1714. The processing unit 1714 can be any of various available processors. Dual microprocessors and other multiprocessor architectures also can be employed as the processing unit 1714.

The system bus 1718 can be any of several types of bus structure(s) including the memory bus or memory controller, a peripheral bus or external bus, and/or a local bus using any variety of available bus architectures including, but not limited to, 8-bit bus, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI).

The system memory 1716 includes volatile memory 1720 and nonvolatile memory 1722. The basic input/output system (BIOS), containing the basic routines to transfer information between elements within the computer 1712, such as during start-up, is stored in nonvolatile memory 1722. By way of illustration, and not limitation, nonvolatile memory 1722 can include read only memory (ROM), programmable ROM (PROM), electrically programmable ROM (EPROM), electrically erasable PROM (EEPROM), or flash memory. Volatile memory 1720 includes random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM).

Computer 1712 also includes removable/non-removable, volatile/non-volatile computer storage media. FIG. 17 illustrates, for example a disk storage 1724. Disk storage 1724 includes, but is not limited to, devices like a magnetic disk drive, floppy disk drive, tape drive, Jaz drive, Zip drive, LS-100 drive, flash memory card, or memory stick. In addition, disk storage 1724 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1724 to the system bus 1718, a removable or non-removable interface is typically used such as interface 1726.

It is to be appreciated that FIG. 17 describes software that acts as an intermediary between users and the basic computer resources described in suitable operating environment 1710. Such software includes an operating system 1728. Operating system 1728, which can be stored on disk storage 1724, acts to control and allocate resources of the computer 1712. System applications 1730 take advantage of the management of resources by operating system 1728 through program modules 1732 and program data 1734 stored either in system memory 1716 or on disk storage 1724. It is to be appreciated that one or more embodiments of the subject disclosure can be implemented with various operating systems or combinations of operating systems.

A user enters commands or information into the computer 1712 through input device(s) 1736. Input devices 1736 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1714 through the system bus 1718 via interface port(s) 1738. Interface port(s) 1738 include, for example, a serial port, a parallel port, a game port, and a universal serial bus (USB). Output device(s) 1740 use some of the same type of ports as input device(s) 1736. Thus, for example, a USB port may be used to provide input to computer 1712, and to output information from computer 1712 to an output device 1740. Output adapter 1742 is provided to illustrate that there are some output devices 1740 like monitors, speakers, and printers, among other output devices 1740, which require special adapters. The output adapters 1742 include, by way of illustration and not limitation, video and sound cards that provide a means of connection between the output device 1740 and the system bus 1718. It should be noted that other devices and/or systems of devices provide both input and output capabilities such as remote computer(s) 1744.

Computer 1712 can operate in a networked environment using logical connections to one or more remote computers, such as remote computer(s) 1744. The remote computer(s) 1744 can be a personal computer, a server, a router, a network PC, a workstation, a microprocessor based appliance, a peer device or other common network node and the like, and typically includes many or all of the elements described relative to computer 1712. For purposes of brevity, only a memory storage device 1446 is illustrated with remote computer(s) 1744. Remote computer(s) 1744 is logically connected to computer 1712 through a network interface 1748 and then physically connected via communication connection 1750. Network interface 1748 encompasses communication networks such as local-area networks (LAN) and wide-area networks (WAN). LAN technologies include Fiber Distributed Data Interface (FDDI), Copper Distributed Data Interface (CDDI), Ethernet/IEEE 802.3, Token Ring/IEEE 802.5 and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1750 refers to the hardware/software employed to connect the network interface 1748 to the bus 1718. While communication connection 1750 is shown for illustrative clarity inside computer 1712, it can also be external to computer 1712. The hardware/software necessary for connection to the network interface 1748 includes, for exemplary purposes only, internal and external technologies such as, modems including regular telephone grade modems, cable modems and DSL modems, ISDN adapters, and Ethernet cards.

Figure 18:
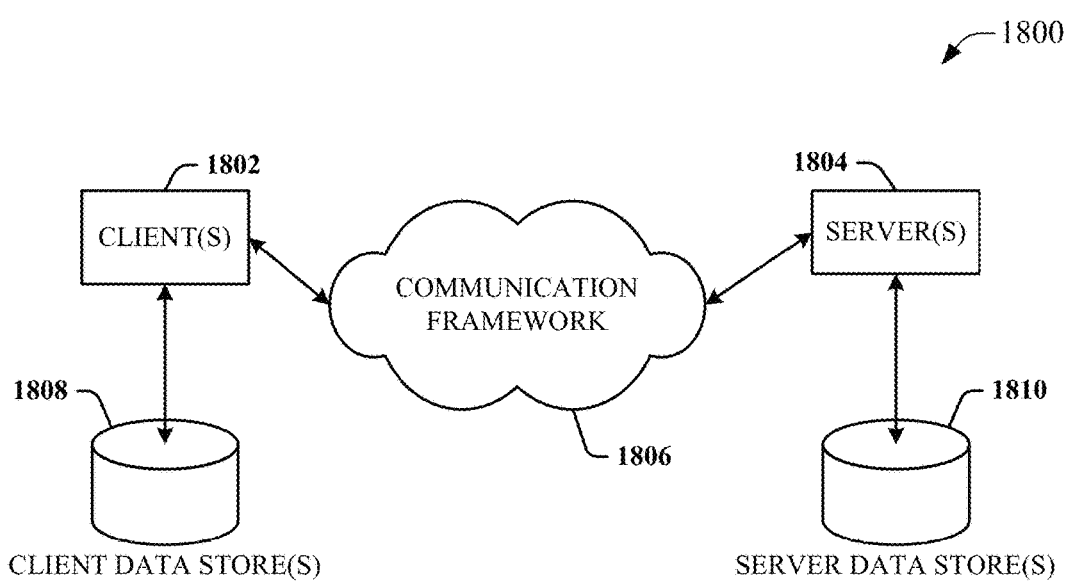
FIG. 18 is an example networking environment.

FIG. 18 is a schematic block diagram of a sample computing environment 1800 with which the disclosed subject matter can interact. The sample computing environment 1800 includes one or more client(s) 1810. The client(s) 1810 can be hardware and/or software (e.g., threads, processes, computing devices). The sample computing environment 1800 also includes one or more server(s) 1830. The server(s) 1830 can also be hardware and/or software (e.g., threads, processes, computing devices). The servers 1830 can house threads to perform transformations by employing one or more embodiments as described herein, for example. One possible communication between a client 1810 and a server 1830 can be in the form of a data packet adapted to be transmitted between two or more computer processes. The sample computing environment 1800 includes a communication framework 1850 that can be employed to facilitate communications between the client(s) 1810 and the server(s) 1830. The client(s) 1810 are operably connected to one or more client data store(s) 1860 that can be employed to store information local to the client(s) 1810. Similarly, the server(s) 1830 are operably connected to one or more server data store(s) 1840 that can be employed to store information local to the servers 1830.

What has been described above includes examples of the subject innovation. It is, of course, not possible to describe every conceivable combination of components or methodologies for purposes of describing the disclosed subject matter, but one of ordinary skill in the art may recognize that many further combinations and permutations of the subject innovation are possible. Accordingly, the disclosed subject matter is intended to embrace all such alterations, modifications, and variations that fall within the spirit and scope of the appended claims.

In particular and in regard to the various functions performed by the above described components, devices, circuits, systems and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the disclosed subject matter. In this regard, it will also be recognized that the disclosed subject matter includes a system as well as a computer-readable medium having computer-executable instructions for performing the acts and/or events of the various methods of the disclosed subject matter.

In addition, while a particular feature of the disclosed subject matter may have been disclosed with respect to only one of several implementations, such feature may be combined with one or more other features of the other implementations as may be desired and advantageous for any given or particular application. Furthermore, to the extent that the terms "includes," and "including" and variants thereof are used in either the detailed description or the claims, these terms are intended to be inclusive in a manner similar to the term "comprising."

In this application, the word "exemplary" is used to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Various aspects or features described herein may be implemented as a method, apparatus, or article of manufacture using standard programming and/or engineering techniques. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks [e.g., compact disk (CD), digital versatile disk (DVD) . . . ], smart cards, and flash memory devices (e.g., card, stick, key drive . . . ).

What is claimed is:

1. A system, comprising:
    a configuration retrieval component configured to discover and retrieve I/O module configuration data associated with a virtualized controller executing on a cloud platform, wherein the I/O module configuration data defines one or more clone I/O points of the virtualized controller, and the virtualized controller executes a control program;
    a data exchange model configured to
    retrieve, from cloud-based storage, a generic I/O module profile corresponding to an I/O module represented by the I/O module configuration data, and
    customize the generic I/O module profile using the I/O module configuration data to yield an available clone I/O point list identifying the one or more clone I/O points of the virtualized controller; and
    an I/O normalization component configured to convert a communication protocol of the one or more clone I/O points to yield one or more converted I/O points that conform to a standardized communication protocol,
    wherein the data exchange model is further configured to exchange simulation data between the one or more converted I/O points and corresponding one or more simulation I/O points of a cloud-based simulation of an industrial automation system in accordance with the standardized communication protocol and based on execution of the control program on the virtualized controller;
    the system further comprises an emulation master role component configured to modify the control program executing on the virtualized controller based on configuration input received via a client device to yield a modified control program, and
    executing the modified control program on a physical industrial controller to cause the physical industrial controller to process input signals received from input devices of the industrial automation system and to control output signals directed to output devices of the industrial automation system.

2. The system of claim 1, wherein the emulation master role component is configured to communicatively link the system to the client device via a cloud portal.

3. The system of claim 2, wherein the emulation master role component is further configured to receive, from the client device, mapping input that selectively associates a clone I/O point from the one or more clone I/O points with a simulation I/O point of the one or more simulation I/O points to yield an I/O point mapping.

4. The system of claim 3, wherein the data exchange model is further configured to exchange the simulation data between the one or more converted I/O points and corresponding one or more simulation I/O points in accordance with the I/O point mapping.

5. The system of claim 3, wherein the emulation master role component is further configured to send the available clone I/O point list to the client device for selection of the clone I/O point to be mapped to the simulation I/O point.

6. The system of claim 1, further comprising a motion analyzer component configured to monitor the cloud-based simulation and the virtualized controller during a simulation sequence and generate a performance statistic for the simulation sequence.

7. The system of claim 1, wherein the data exchange model is further configured to update at least one of the cloud-based simulation or the virtualized controller based on operational data generated by the industrial automation system and received at the cloud platform.

8. The system of claim 7, further comprising receiving the operational data from a cloud agent device that collects the operational data from the industrial automation system and sends the operational data to the cloud platform.

9. A method, comprising:
    retrieving, by a system comprising a processor, I/O module configuration information from a virtualized controller instantiated in the cloud platform, wherein the virtualized controller executes a control program, and the I/O module configuration information defines one or more clone I/O points of the virtualized controller;
    identifying, by the system, an I/O module corresponding to the I/O module configuration information;
    retrieving, by the system, a generic I/O module profile corresponding to the I/O module from cloud storage;
    customizing, by the system, the generic I/O module profile using the I/O module configuration information resulting in an available clone I/O point list identifying the one or more clone I/O points of the virtualized controller;
    converting, by the system, a communication protocol of the one or more clone I/O points to a standardized communication protocol to yield one or more converted I/O points of the virtualized controller;

exchanging, by the system, simulation data between the one or more converted I/O points and one or more simulation data points of an industrial automation simulation in accordance with the standardized communication protocol and based on execution of the control program on the virtualized controller, wherein the industrial automation simulation simulates an industrial automation system;

modifying, by the system, the control program executing on the virtualized controller in accordance with configuration input received from a client device communicatively connected to the cloud platform to yield a modified control program; and executing the modified control program on a physical industrial controller, wherein the executing causes the physical industrial controller to process input signals received from input devices of an industrial automation system and to control output signals directed to output devices of the industrial automation system.

10. The method of claim 9, further comprising receiving, from the client device, mapping input data that selectively associates one of the one or more converted I/O points with a simulation point of the one or more simulation points to yield an I/O point mapping.

11. The method of claim 10, wherein the exchanging the simulation data comprises exchanging the simulation data between the one or more converted I/O points and the one or more simulation data points based on the I/O point mapping.

12. The method of claim 10, further comprising sending the available clone I/O point list to the client device,
wherein the receiving the mapping input data comprises receiving the mapping input data generated based on interaction with the available clone I/O point list via the client device.

13. The method of claim 9, further comprising:
executing a simulation sequence of the industrial automation simulation and the virtualized controller; and
generating simulation performance data based on a monitoring of the virtualized controller and the industrial automation simulation during the simulation sequence.

14. The method of claim 9, further comprising:
receiving at least one of operational data or device configuration data generated by industrial devices of the industrial automation system corresponding to the industrial automation simulation; and
modifying at least one of the industrial automation simulation or the virtualized controller based on at least one of the operational data or the device configuration data.

15. A non-transitory computer-readable medium having stored thereon instructions that, in response to execution, cause a system comprising a processor to perform operations, the operations comprising:
discovering an I/O module configuration corresponding to an I/O module instance defined in a virtualized controller instantiated on a cloud platform, wherein the I/O module configuration defines one or more clone I/O points of the virtualized controller, and the virtualized controller executes a control program;
retrieving, from a module profile storage maintained on the cloud platform, a generic I/O module profile corresponding to an I/O module identified by the I/O module configuration;
customizing the generic I/O module profile using the I/O module configuration to yield an available clone I/O point list identifying the one or more clone I/O points of the virtualized controller;
converting a communication protocol of the one or more clone I/O points to a standardized communication protocol to yield one or more converted I/O points of the virtualized controller;
performing a simulation sequence using the virtualized controller executing the control program and a simulation that executes on the cloud platform, wherein the simulation simulates an industrial automation system, and the performing comprises exchanging simulation data between the simulation and the virtualized controller via the one or more converted I/O points according to the standardized communication protocol and based on execution of the control program on the virtualized controller;
modifying the control program executing on the virtualized controller based on configuration input received from a client device communicatively connected to the cloud platform to yield a modified control program; and
executing the modified control program on a physical industrial controller of the industrial automation system, wherein the executing causes the physical industrial controller to process input signals received from input devices of an industrial automation system and to control output signals directed to output devices of the industrial automation system.

16. The non-transitory computer-readable medium of claim 15, wherein the operations further comprise communicatively linking a clone I/O point selected from the available clone I/O point list to a simulation I/O point of the simulation based on mapping data received from the client device, and wherein the mapping data selects the clone I/O point to be linked to the simulated I/O point.

17. The non-transitory computer-readable medium of claim 16, wherein the operations further comprise:
rendering the available clone I/O point list on the client device; and
receiving the mapping data from the client device via interaction with the available clone I/O point list via the client device.

18. The non-transitory computer-readable medium of claim 15, wherein the operations further comprise generating simulation performance data based on a monitoring of the virtualized controller and the simulation during the simulation sequence.

19. The non-transitory computer-readable medium of claim 15, wherein the operations further comprise:
monitoring for a change to at least one of the modified control program executing on the physical industrial controller or a configuration of the physical industrial controller; and
in response to detecting the change based on the monitoring, updating the virtualized controller in accordance with the change.

20. The non-transitory computer-readable medium of claim 15, wherein the operations further comprise:
receiving at least one of operational data or device configuration data generated by industrial devices of the industrial automation system; and
modifying the simulation based on at least one of the operational data or the device configuration data.

* * * * *